United States Patent
Woo

(10) Patent No.: US 10,861,577 B2
(45) Date of Patent: Dec. 8, 2020

(54) MODULE CONTROLLERS FOR MEMORY DEVICES AND MEMORY MODULES INCLUDING THE MODULE CONTROLLERS

(71) Applicant: SK hynix Inc., Icheon-si (KR)

(72) Inventor: Su Hae Woo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 124 days.

(21) Appl. No.: 16/205,747

(22) Filed: Nov. 30, 2018

(65) Prior Publication Data

US 2019/0325982 A1 Oct. 24, 2019

(30) Foreign Application Priority Data

Apr. 18, 2018 (KR) .................. 10-2018-0045080

(51) Int. Cl.
| | | |
|---|---|---|
| *G11C 29/44* | (2006.01) | |
| *G11C 29/42* | (2006.01) | |
| *G11C 29/52* | (2006.01) | |
| *G06F 11/10* | (2006.01) | |

(52) U.S. Cl.
CPC ...... *G11C 29/4401* (2013.01); *G06F 11/1068* (2013.01); *G11C 29/42* (2013.01); *G11C 29/52* (2013.01)

(58) Field of Classification Search
CPC .................. G11C 29/4401; G11C 29/42
See application file for complete search history.

(56) References Cited

U.S. PATENT DOCUMENTS

| | | | | |
|---|---|---|---|---|
| 5,655,113 A * | 8/1997 | Leung | ............... | G06F 13/40 |
| | | | | 711/167 |
| 6,304,989 B1 * | 10/2001 | Kraus | ............... | G11C 29/44 |
| | | | | 714/733 |
| 7,536,614 B1 * | 5/2009 | Ma | ............... | G11C 29/44 |
| | | | | 365/200 |
| 9,430,324 B2 * | 8/2016 | Ware | ............... | G11C 29/42 |
| 2002/0159305 A1 * | 10/2002 | Yoo | ............... | G11C 29/44 |
| | | | | 365/200 |

(Continued)

FOREIGN PATENT DOCUMENTS

| | | |
|---|---|---|
| KR | 1020020014794 A | 2/2002 |
| KR | 1020140125981 A | 10/2014 |

OTHER PUBLICATIONS

Hongbin Sun, Jizhong Zhao, Fei Wang and Nanning Zheng; Cost-Efficient Built-In Repair Analysis form Embedded Memories with On-Chip ECC; 2011 1st International Symposium on Access Spaces (ISAS), IEEE-ISAS 2011, pp. 95-100 (Year: 2011).*

*Primary Examiner* — Joseph D Torres
(74) *Attorney, Agent, or Firm* — William Park & Associates Ltd.

(57) ABSTRACT

A test circuit includes a built-in self-test (BIST) circuit and a built-in repair analysis (BIRA) circuit. The built-in self-test (BIST) circuit performs a test operation for a plurality of memory packages to generate fail information. The built-in repair analysis (BIRA) circuit receives the fail information from the BIST circuit to select at least one of the plurality of memory packages as a repair target memory package. The repair target memory package is selected by considering an error correction capability of an error correction code (ECC) circuit and usability of redundancy regions included in each of the plurality of memory packages.

28 Claims, 22 Drawing Sheets

(56) References Cited

U.S. PATENT DOCUMENTS

| | | | |
|---|---|---|---|
| 2006/0064618 A1* | 3/2006 | Wu | G11C 29/16 |
| | | | 714/733 |
| 2008/0065929 A1* | 3/2008 | Nadeau-Dostie | G11C 29/4401 |
| | | | 714/5.11 |
| 2009/0172483 A1* | 7/2009 | Anzou | G11C 29/44 |
| | | | 714/723 |
| 2010/0251043 A1* | 9/2010 | Anzou | G11C 29/02 |
| | | | 714/719 |
| 2011/0058434 A1* | 3/2011 | Anzou | G11C 29/785 |
| | | | 365/200 |
| 2017/0052845 A1 | 2/2017 | Ware et al. | |

* cited by examiner

FIG.11

| FAIL INFORMATION | EXEMPLARY DATA |
|---|---|
| CHIP SELECTION SIGNAL (CS) (2 BITS) | 01 |
| CHIP IDENTIFICATION (CID) (3 BITS) | 000 |
| BANK GROUP ADDRESS (2 BITS) | 01 |
| BANK ADDRESS (2 BITS) | 10 |
| ROW ADDRESS (18 BITS) | 0001010101010101 |
| FAIL INFORMATION FOR EACH PACKAGE | 000001001010100 |

FIG.22

|  | PKG4 | PKG3 | PKG2 | PKG1 | PKG0 |
|---|---|---|---|---|---|
| fcn1_PKG | 1 | 1 | 1 | 1 | 0 |
| fcn2_PKG | 0 | 0 | 0 | 0 | 0 |
| fcn3_PKG | 0 | 0 | 0 | 0 | 0 |
| fcn4_PKG | 0 | 0 | 0 | 0 | 1 |

REAIR TARGET (PKG4), REAIR TARGET (PKG0)

601C, 601-1, 601-2, 601-3, 601-4

MODULE CONTROLLERS FOR MEMORY DEVICES AND MEMORY MODULES INCLUDING THE MODULE CONTROLLERS

CROSS-REFERENCE TO RELATED APPLICATIONS

The present application claims priority under 35 U.S.C 119(a) to Korean Application No. 10-2018-0045080, filed on Apr. 18, 2018, which is herein incorporated by references in its entirety.

BACKGROUND

1. Technical Field

Various embodiments of the present disclosure relate to memory devices and, more particularly, to module controllers for memory devices and memory modules including the module controllers.

2. Related Art

As semiconductor memory devices become more highly integrated, storage capacities of the semiconductor memory devices have rapidly increased with the development of semiconductor technologies. The increase of the storage capacities of the semiconductor memory devices may lead to an increase in the number of memory cells included in each of the semiconductor memory devices. If the number of memory cells in the semiconductor memory devices increases, the probability that failed memory cells are formed may also increase. Thus, a cell array region of each memory device may be designed to include a redundant cell region in consideration of formation of the failed memory cells. If the failed memory cells are formed in the cell array region, the failed memory cells may be replaced with redundant memory cells included in the redundant cell region using information on the failed memory cells.

Recently, a lot of effort has been focused on utilizing three-dimensional integration techniques to improve the performance of the semiconductor memory devices with low power consumption. The three-dimensional integration techniques may correspond to fabrication techniques for vertically stacking memory chips or memory cells to increase the integration density of the semiconductor memory devices. As such, in the event that the three-dimensional integration techniques are used to realize highly integrated memory packages, the reliability of the memory cells in the memory chips may become more important.

SUMMARY

According to an embodiment, a test circuit may be provided. The test circuit may include a built-in self-test (BIST) circuit and a built-in repair analysis (BIRA) circuit. The built-in self-test (BIST) circuit may perform a test operation for a plurality of memory packages to generate fail information. The built-in repair analysis (BIRA) circuit may receive the fail information from the BIST circuit to select at least one of the plurality of memory packages as a repair target memory package. The repair target memory package may be selected by considering an error correction capability of an error correction code (ECC) circuit and usability of redundancy regions included in each of the plurality of memory packages.

According to an embodiment, a memory module may be provided. The memory module may include a plurality of memory packages and a module controller configured to control an operation of the plurality of memory packages. The module controller may include an error correction code (ECC) circuit and a test circuit. The test circuit may include a built-in self-test (BIST) circuit and a built-in repair analysis (BIRA) circuit. The built-in self-test (BIST) circuit may perform a test operation for the plurality of memory packages to generate fail information. The built-in repair analysis (BIRA) circuit may receive the fail information from the BIST circuit to select at least one of the plurality of memory packages as a repair target memory package. The repair target memory package may be selected by considering an error correction capability of the error correction code (ECC) circuit and usability of redundancy regions included in each of the plurality of memory packages.

According to an embodiment, a method may be provided. The method may include performing, with a built-in self-test (BIST) circuit, a test operation for the plurality of memory packages to generate fail information. The method may include selecting, with a built-in repair analysis (BIRA) circuit, at least one of the plurality of memory packages as the repair target memory package based on the fail information. The repair target memory package may be selected by considering an error correction capability of an error correction code (ECC) circuit and usability of redundancy regions included in each of the plurality of memory packages

BRIEF DESCRIPTION OF THE DRAWINGS

FIG. 11 is a table illustrating fail information that is transmitted from a built-in self-test (BIST) circuit to a built-in repair analysis (BIRA) circuit during an operation of a test circuit for a memory device according to an embodiment of the present disclosure.

FIG. 22 illustrates yet another example of a first register included in a built-in repair analysis (BIRA) circuit after a repair target memory package is selected while an operation of a test circuit according to an embodiment is performed.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments may be directed to test circuits for memory devices and memory modules including the test circuits.

Figure 1:
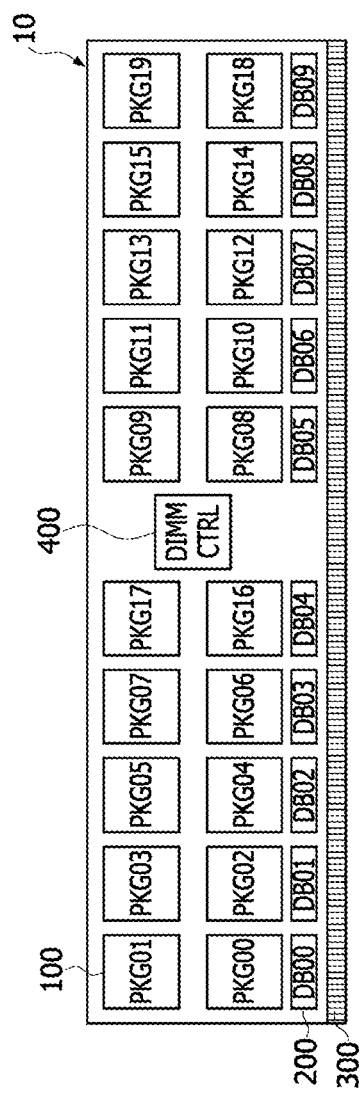
FIG. 1 is a block diagram illustrating an example of a memory module according to an embodiment of the present disclosure.

FIG. 1 is a block diagram illustrating an example of a memory module 10 according to an embodiment of the present disclosure. Referring to FIG. 1, the memory module 10 may be configured to include a plurality of memory packages 100, a plurality of data buffers 200, a tab 300 and a module controller (DIMM CTRL) 400. Although FIG. 1 illustrates an example in which the memory module 10 includes eighteen memory packages 100 (i.e., first to eighteenth memory packages PKG01~PKG18), the present disclosure is not limited thereto. For example, in some other embodiments, the number of the memory packages 100 may be less than or greater than eighteen. The number of the memory packages 100 included in the memory module 10 may be set to be different according to a configuration of the memory module 10, for example, an input/output (I/O) configuration of the memory module 10. The plurality of memory packages 100, the plurality of data buffers 200 and the module controller (DIMM CTRL) 400 may be mounted on a substrate such as a printed circuit board (PCB). The tab 300 attached to an end of the substrate may have a plurality of connecting terminals (also, referred to as 'tab pins'). The tab 300 may include command/address input pins, clock input pins and data I/O pins.

Figure 2:
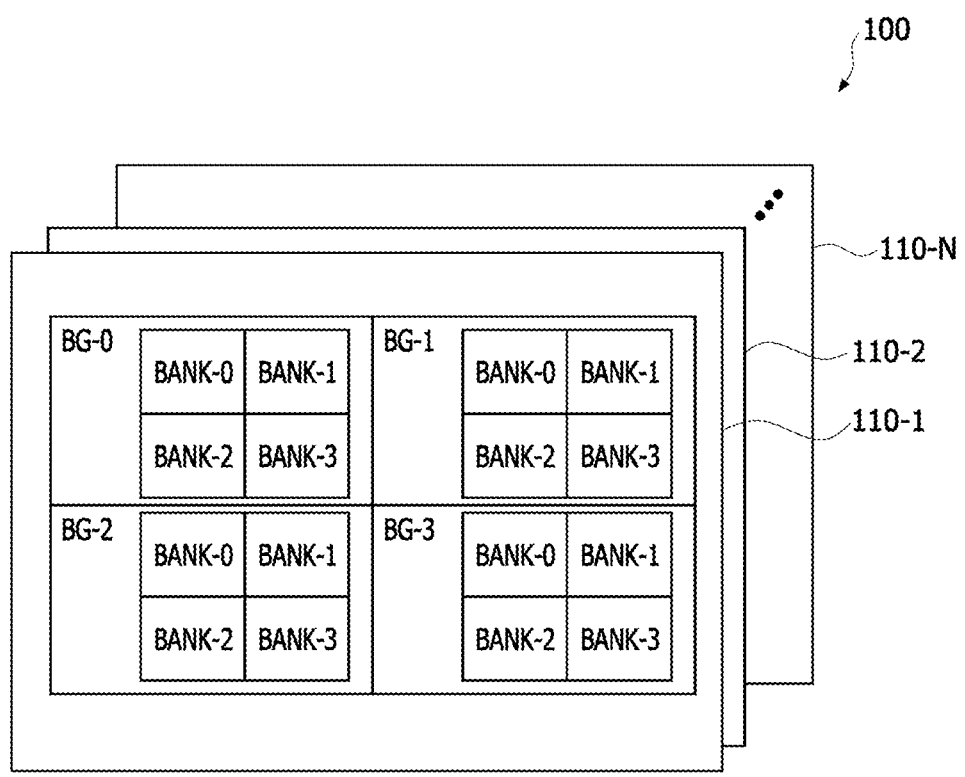
FIG. 2 is a block diagram illustrating a configuration of a memory package included in the memory module of FIG. 1.

FIG. 2 is a block diagram illustrating a configuration of any one of the memory packages 100 included in the memory module 10 of FIG. 1. The memory package 100 may include a plurality of memory chips (or a plurality of memory dies), for example, first to $N^{th}$ memory chips 110-1, 110-2, ... and 110-N. In an embodiment, the first to $N^{th}$ memory chips 110-1, 110-2, ... and 110-N may be vertically stacked on a surface of a package substrate. The first to $N^{th}$ memory chips 110-1, 110-2, ... and 110-N may have the same configuration. In such a case, the first memory chip 110-1 may have, for example, four bank groups (i.e., first to fourth bank groups BG-0, BG-1, BG-2 and BG-3). The first to fourth bank groups BG-0, BG-1, BG-2 and BG-3 may have the same configuration. One of the first to fourth bank groups BG-0, BG-1, BG-2 and BG-3 may be designated by a bank group address. Each of the first to fourth bank groups BG-0, BG-1, BG-2 and BG-3 may have, for example, four banks (i.e., first to fourth banks BANK-0, BANK-1, BANK-2 and BANK-3). Thus, the first memory chip 110-1 may include sixteen banks. The first to fourth banks BANK-0, BANK-1, BANK-2 and BANK-3 may have the same configuration. One of the first to fourth banks BANK-0, BANK-1, BANK-2 and BANK-3 may be designated by a bank address.

Figure 3:
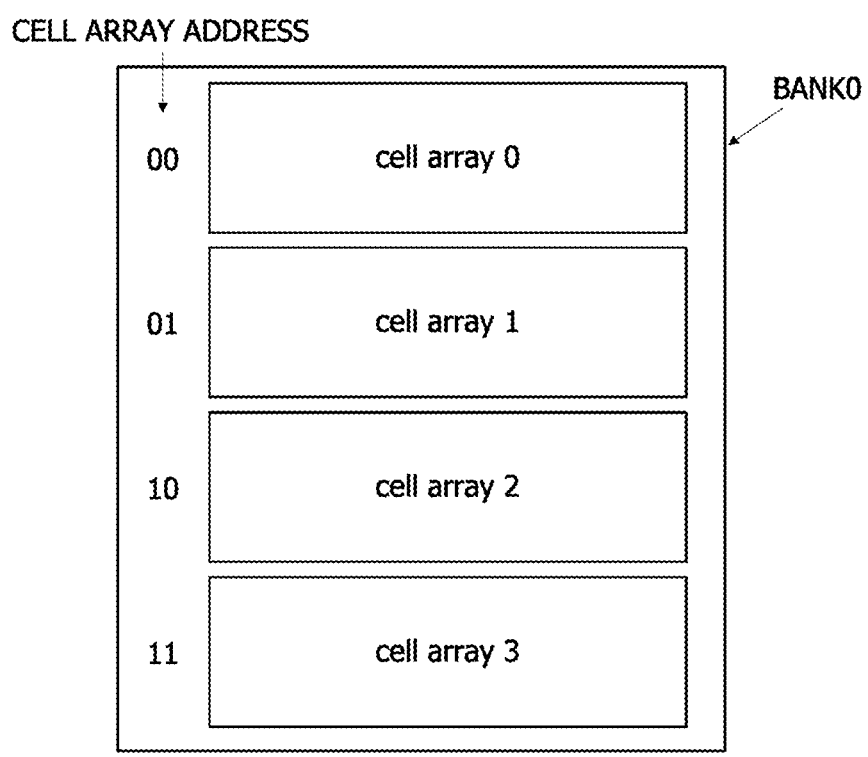
FIG. 3 is a schematic view illustrating a configuration of a bank included in the memory package of FIG. 2.

FIG. 3 is a schematic view illustrating a configuration of the first bank BANK-0 of the first memory chip 110-1 included in the memory package 100 of FIG. 2. Referring to FIG. 3, the first bank BANK-0 may include, for example, four cell array regions (i.e., first to fourth cell array regions cell_array_0, cell_array_1, cell_array_2 and cell_array_3). The first to fourth cell array regions cell_array_0, cell_array_1, cell_array_2 and cell_array_3 may have the same configuration. One of the first to fourth cell array regions cell_array_0, cell_array_1, cell_array_2 and cell_array_3 may be designated by a cell array address. The first cell array region cell_array_0 may have a cell array address of "00". The second cell array region cell_array_1 may have a cell array address of "01". The third cell array region cell_array_2 may have a cell array address of "10". The fourth cell array region cell_array_3 may have a cell array address of "11".

Figure 4:
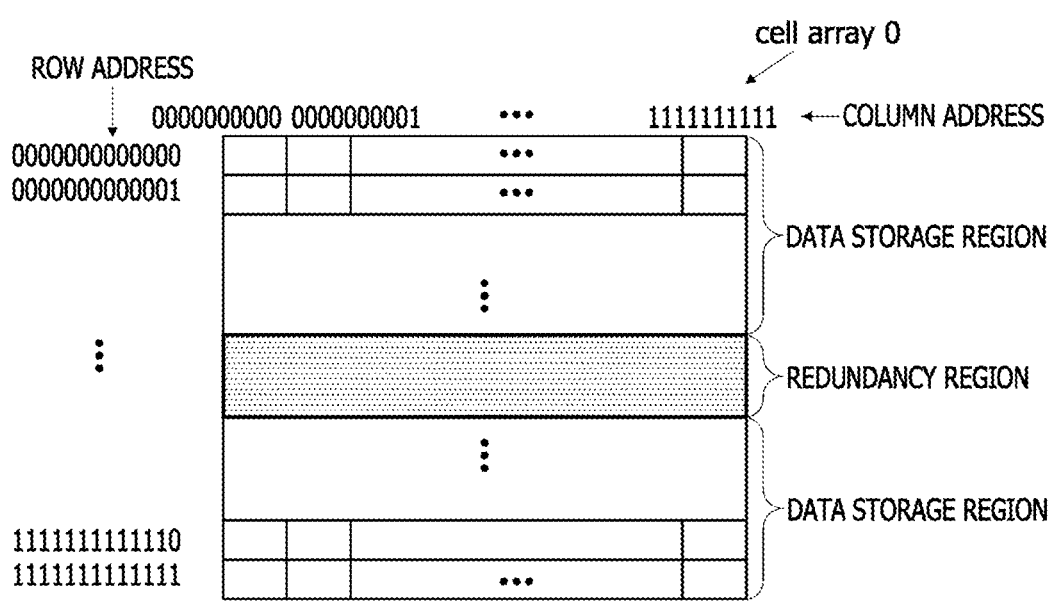
FIG. 4 is a schematic view illustrating a configuration of a cell array region included in the bank of FIG. 3.

FIG. 4 is a schematic view illustrating a configuration of the first cell array region cell_array_0 included in the first bank BANK-0 of FIG. 3. Referring to FIG. 4, the first cell array region cell_array_0 may include a plurality of memory cells which are arrayed in a matrix form along a plurality of rows and a plurality of columns. The first cell array region cell_array_0 may include a data storage region and a redundancy region. The data storage region may correspond to a cell region including main memory cells, and the redundancy region may be a cell region including redundant memory cells for replacing failed memory cells among the main memory cells. In an embodiment, each of the rows may have its own row address, and each of the columns may have its own column address. Thus, one of the rows may be designated by a row address, and one of the columns may be designated by a column address. While the main memory cells in the data storage region do not share any row address with the redundant memory cells in the redundancy region, the main memory cells in the data storage region may share column addresses with the redundant memory cells in the redundancy region. In an embodiment, a row address for selecting any one of the main memory cells may be configured to have a thirteen-bit binary number form, and a column address for selecting any one of the main memory cells may be configured to have a ten-bit binary number form. In such a case, the data storage region of the first cell array region cell_array_0 may have one mega-byte storage capacity. A configuration of the data storage region and the redundancy region in the first cell array region cell_array_0 may be set to be different according to the embodiments.

Figure 5:
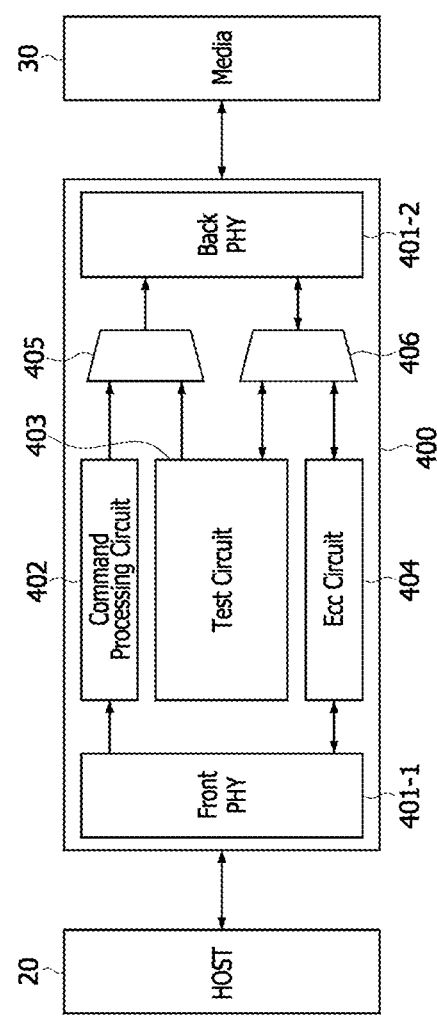
FIG. 5 is a block diagram illustrating a configuration of a module controller included in the memory module of FIG. 1.

FIG. 5 is a block diagram illustrating a configuration of the module controller 400 included in the memory module 10 of FIG. 1. Referring to FIG. 5, the module controller 400 may include a front physical layer 401-1 acting as an interface between the module controller 400 and a host 20 and a back physical layer 401-2 acting as an interface between the module controller 400 and a memory medium 30. In an embodiment, the memory medium 30 may include the plurality of memory packages (100 of FIG. 1) disposed in the memory module (10 of FIG. 1). The module controller 400 may further include a command processing circuit 402, a test circuit 403 and an error correction code (ECC) circuit 404. Moreover, the module controller 400 may further include a unidirectional multiplexer 405 and a bidirectional multiplexer 406.

The command processing circuit 402 may receive a command from the host 20 through the front physical layer 401-1 and may output the command to the memory medium 30 through the unidirectional multiplexer 405 and the back physical layer 401-2. The test circuit 403 may test all of the memory packages 100 and may select one or more repair target memory packages among the tested memory packages 100 according to the test result. The test circuit 403 may also perform a repair operation of the repair target memory package which is selected according to the test result. In addition, the test circuit 403 may store a status of the redundancy regions in the memory medium 30 and addresses of repair target regions in the memory medium 30. The test circuit 403 may be coupled to the back physical layer 401-2 through the unidirectional multiplexer 405 and the bidirectional multiplexer 406. If write data outputted from the host 20 are inputted to the ECC circuit 404 through the front physical layer 401-1, the ECC circuit 404 may perform an ECC encoding operation of the write data to generate ECC encoded data and may output the ECC encoded data to the memory medium 30 through the bidirectional multiplexer 406 and the back physical layer 401-2.

If read data outputted from the memory medium 30 are inputted to the ECC circuit 404 through the back physical layer 401-2 and the bidirectional multiplexer 406, the ECC circuit 404 may perform an ECC decoding operation of the read data to correct erroneous bits of the read data and may output the corrected read data to the host 20 through the front physical layer 401-1. While the ECC circuit 404 performs the ECC decoding operation of the read data, the ECC circuit 404 may correct erroneous bits of the read data within an error correction capability of the ECC circuit 404. The error correction capability of the ECC circuit 404 may be defined as the number of maximum erroneous bits (or maximum erroneous symbols) that are able to be corrected by the ECC encoding operation and the ECC decoding operation.

Figure 6:
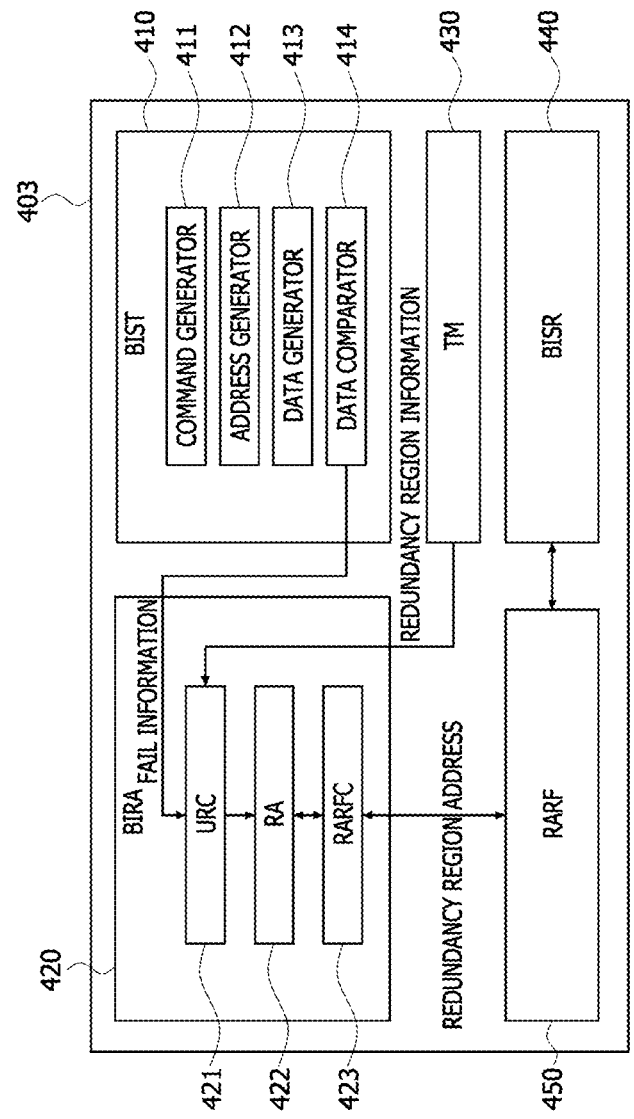
FIG. 6 is a block diagram illustrating an example of a test circuit according to an embodiment of the present disclosure.

FIG. 6 is a block diagram illustrating an example of the test circuit 403 according to an embodiment of the present disclosure. Referring to FIG. 6, the test circuit 403 may be configured to include a built-in self-test (BIST) circuit 410, a built-in repair analysis (BIRA) circuit 420, a test mode (TM) circuit 430, a built-in self-repair (BISR) circuit 440 and a repair address register file (RARF) 450. The test circuit 403 may perform a test operation of the plurality of memory packages (100 of FIG. 1) to obtain fail information and may select one or more repair target memory packages among the tested memory packages using the fail information. The repair target memory package may be selected by considering the error correction capability of the ECC circuit 404 and the usability of the redundancy regions included in each of the memory packages 100.

The BIST circuit 410 may perform a test operation of the plurality of memory packages 100 to generate and output the fail information. The test operation may be performed using a test algorithm for the memory cells included in each of the memory packages 100. In order to perform the test operation using a test algorithm, the BIST circuit 410 may be configured to include a command generator 411, an address generator 412, a data generator 413 and a data comparator 414. The command generator 411 may generate a write command and a read command for the test operation. The address generator 412 may generate addresses of memory cells to be tested by a read operation and a write operation. The data generator 413 may generate a test pattern applied to the memory cells to be tested. The data comparator 414 may compare data read out of the memory cells with the test pattern written into the memory cells to discriminate whether each of the memory cells is a failed memory cell and may generate the fail information on the failed memory cells to output the fail information to the BIRA circuit 420.

If the fail information outputted from the data comparator 414 of the BIST circuit 410 is inputted to the BIRA circuit 420, the BIRA circuit 420 may analyze the fail information to select a memory package to be repaired among the tested memory packages 100. In such a case, the BIRA circuit 420 may operate to minimize the number of repair target memory packages in consideration of a status of the redundancy regions in the cell array regions and the error correction capability of the ECC circuit 404. The BIRA circuit 420 may include an unrepair control (URC) circuit 421, a repair analysis (RA) circuit 422 and a repair address register file control (RARFC) circuit 423.

The URC circuit 421 may analyze the fail information to obtain fail distribution data and may receive information on the status of the redundancy regions of the cell arrays included in each of the memory packages 100 to determine execution/nonexecution of a built-in repair analysis (BIRA) operation. The fail distribution data obtained by the URC circuit 421 may be stored into a first register of the URC circuit 421 in the form of the number of the failed memory cells by the memory packages 100. That is, a binary number corresponding to the number of all of failed memory cells in each of the memory packages 100 may be stored into the first register of the URC circuit 421. The URC circuit 421 may set a failure criterion (FC) restricted within the range of the error correction capability of the ECC circuit 404 in order to consider the error correction capability of the ECC circuit 404 during operation of the URC circuit 421. In an embodiment, if the error correction capability of the ECC circuit 404 is 'M' bits (or 'M' symbols), the failure criterion (FC) may be set as a natural number which is greater than zero and which is equal to or less than 'M'. The set value for a failure criterion (FC) is also referred to herein as a failure criterion value.

The URC circuit 421 may receive the information on the statuses of the redundancy regions (also, referred to as 'redundancy region information') in the cell array regions from the memory medium 30 through the TM circuit 430 by the memory packages 100. The redundancy region information inputted to the URC circuit 421 may be stored into a second register of the URC circuit 421. The URC circuit 421 may compare the number of all of failed memory cells included in the cell array regions having unusable redundancy regions, which are no longer usable in a repair process in each of the memory packages 100, with the failure criterion (FC) to determine execution or nonexecution of the built-in repair analysis (BIRA) operation. The unusable redundancy region may correspond to the redundancy region that has been already used in a previous repair process not to have available redundant memory cells. In an embodiment, if the number of all of failed memory cells included in the cell array regions having the unusable redundancy regions in each memory package is equal to or greater than the failure criterion (FC), the built-in repair analysis (BIRA) operation may terminate because the memory package cannot be repaired with the unusable redundancy region. In contrast, if there is no memory package without the unusable redundancy region or the number of all of failed memory cells included in the cell array regions having the unusable redundancy regions in each memory package is less than the failure criterion (FC), the built-in repair analysis (BIRA) operation may be continuously performed.

The RA circuit 422 may terminate the built-in repair analysis (BIRA) operation under a certain condition or may perform an operation for selecting the repair target memory packages while the built-in repair analysis (BIRA) operation is performed by the URC circuit 421. For example, the RA circuit 422 may terminate the built-in repair analysis (BIRA) operation if the number of the failed memory cells is updated to have a value that remains after subtracting the number of the failed memory cells in the repair target memory package from a total number of the failed memory cells and the updated number of the failed memory cells is less than the failure criterion (FC). In contrast, the RA circuit 422 may select the repair target memory packages such that the number of the memory packages other than the repair target memory packages is maximized if the updated number of the failed memory cells is equal to or greater than the failure criterion (FC). In order that the RA circuit 422 terminates the built-in repair analysis (BIRA) operation or selects the repair target memory packages, the RA circuit 422 may receive address information of the redundancy regions of the memory packages to be repaired from the RARF 450 through the RARFC circuit 423.

The RARFC circuit 423 may transmit information on the repair target memory packages and repair target addresses stored in the RARF 450 to the RA circuit 422 during the built-in repair analysis (BIRA) operation. The RARFC circuit 423 may also receive information on the repair target memory packages and the repair target addresses selected during the built-in repair analysis (BIRA) operation from the RA circuit 422 and may output the information on the repair target memory packages and the repair target addresses to the RARF 450 in order to store the information on the repair target memory packages and the repair target addresses to the RARF 450 into the RARF 450. In addition, the RARFC circuit 423 may discriminate whether the redundancy regions in the repair target memory package are usable in a repair process after the repair target memory package is selected and may terminate the built-in repair analysis (BIRA) operation, may store the information on the repair target memory package and the repair target addresses into the RARF 450, or may set a BIST retry flag signal to perform a built-in self-repair (BISR) operation again, according to the discrimination result.

The TM circuit 430 may obtain the information on the statuses of the redundancy regions (also, referred to as 'redundancy region information') from the memory medium 300 and may transmit the redundancy region information to the URC circuit 421. The BISR circuit 440 may receive the information on the repair target memory packages and repair target addresses stored in the RARF 450 and may perform a repair process of the repair target memory packages.

Figure 7:
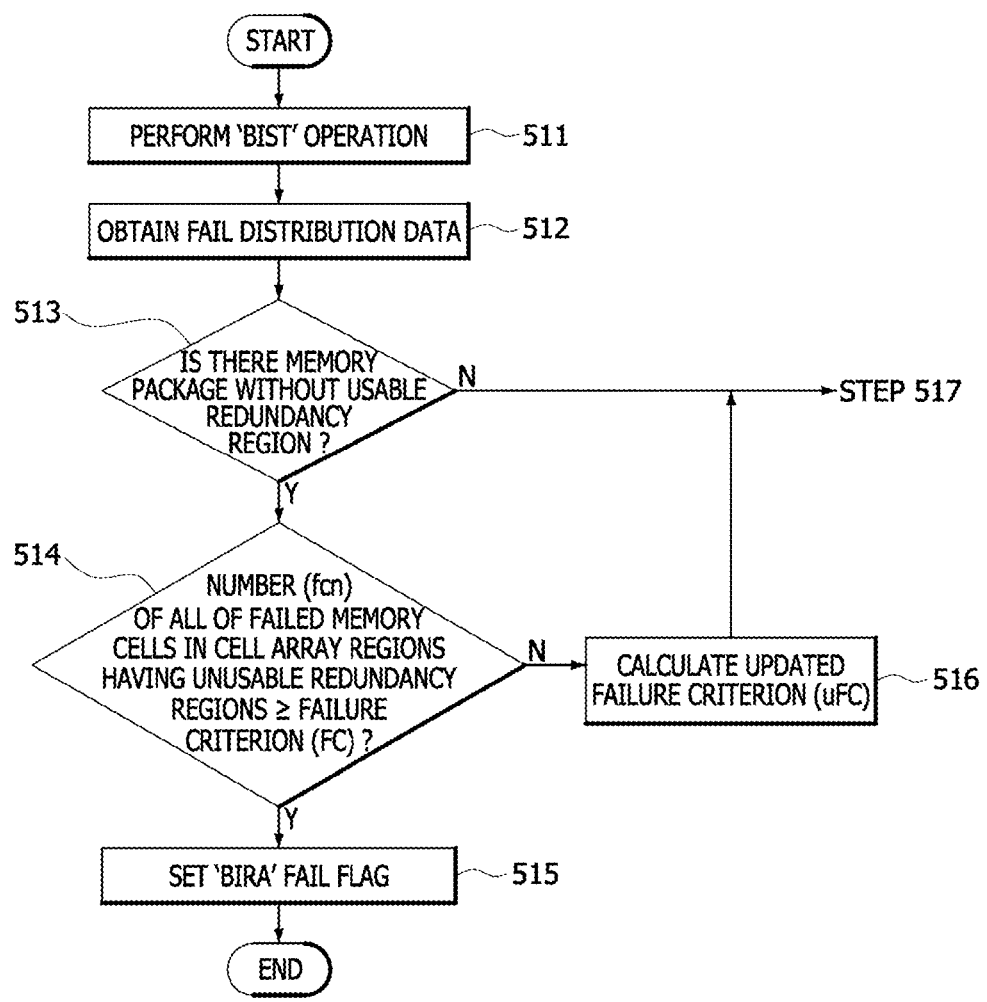
FIGS. 7 to 9 are flowcharts illustrating an operation of a test circuit for a memory device according to an embodiment of the present disclosure.
Figure 8:
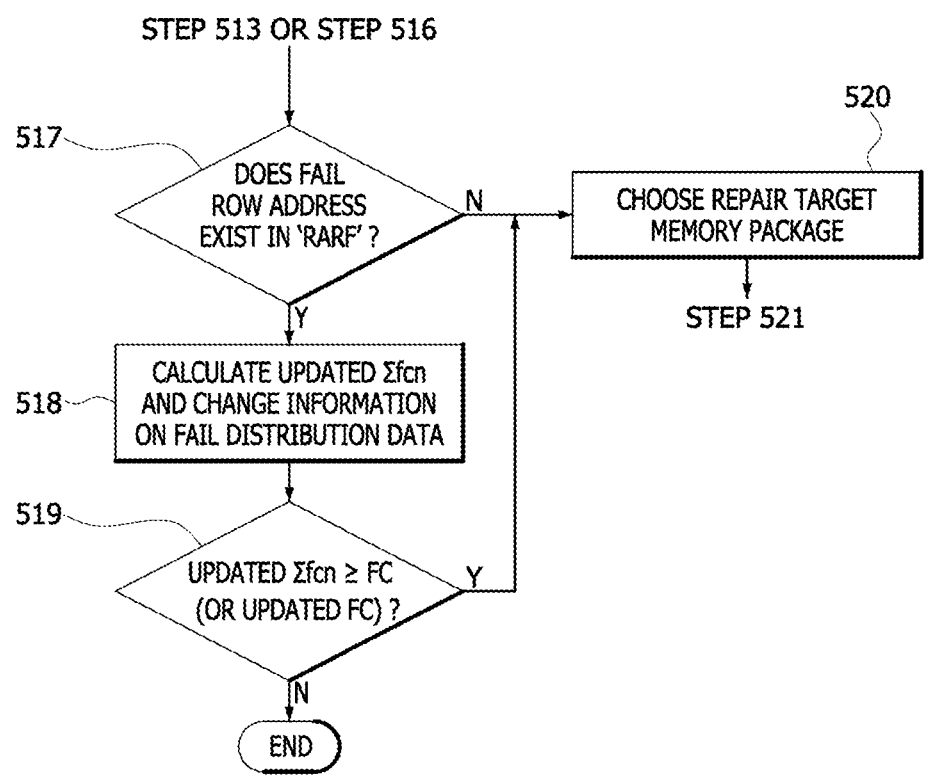
Figure 9:
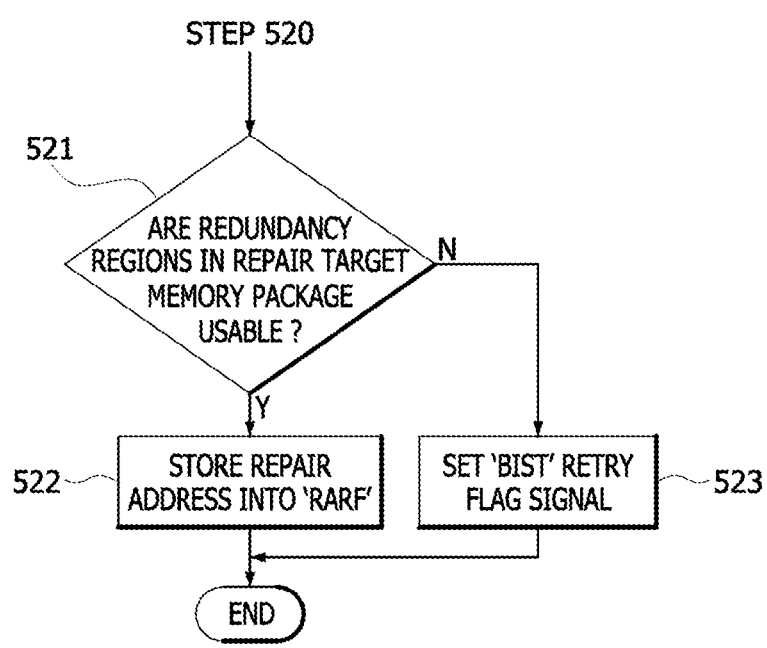
Figure 10:
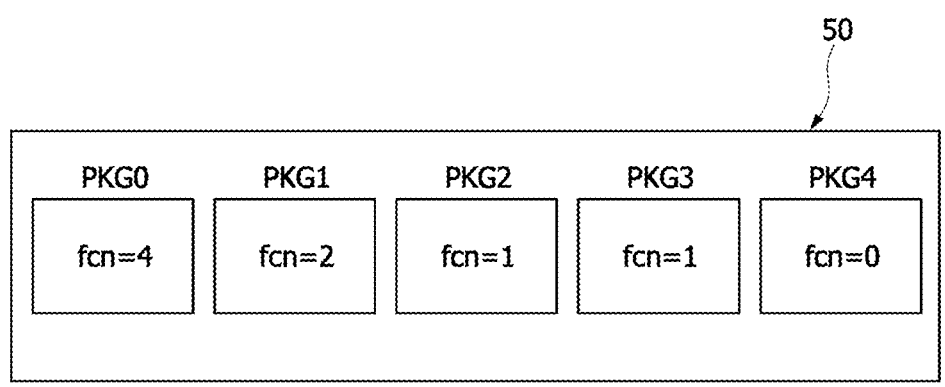
FIG. 10 is a block diagram illustrating a memory module used in describing an operation of a test circuit for a memory device according to an embodiment of the present disclosure.

FIGS. 7 to 9 are flowcharts illustrating a test method according to an embodiment of the present disclosure, and FIGS. 10 to 22 illustrate various steps included in the test method shown in FIGS. 7 and 9. Hereinafter, the test method according to an embodiment will be described with reference to FIGS. 7 to 22. First, referring to FIG. 7, the BIST circuit (410 of FIG. 6) may perform a test operation of the memory packages (100 of FIG. 1) included in the memory module (10 of FIG. 1) (see a step 511). As a result of the test operation performed at the step 511, the BIST circuit 410 may transmit the fail information on the memory packages 100 to the URC circuit 421 of the BIRA circuit 420. The present embodiment will be described hereinafter in conjunction with a memory module 50 including five memory packages (i.e., first to fifth memory packages PKG0~PKG4) (see FIG. 10). In FIG. 10, a module controller is omitted. In addition, the present embodiment will be described in conjunction with an example in which the number (fcn) of failed memory cells included in the cell array regions having the unusable redundancy regions in the first memory package PKG0 is four bits (or four symbols), the number (fcn) of failed memory cells included in the cell array regions having the unusable redundancy regions in the second memory package PKG1 is two bits (or two symbols), the number (fcn) of failed memory cells included in the cell array regions having the unusable redundancy regions in the third memory package PKG2 is one bit (or one symbol), the number (fcn) of failed memory cells included in the cell array regions having the unusable redundancy regions in the fourth memory package PKG3 is one bit (or one symbol), and the number (fcn) of failed memory cells included in the cell array regions having the unusable redundancy regions in the fifth memory package PKG4 is zero bit (or zero symbol) after a built-in self-test (BIST) operation is performed by the built-in self-test (BIST) circuit 410.

As illustrated in FIG. 11, the fail information transmitted from the BIST circuit 410 to the URC circuit 421 of the BIRA circuit 420 may include a chip selection signal CS, a chip identification CID, a bank group address, a bank address, a row address, and fail information for each memory package (also, referred to as 'fail information for each package'). In an embodiment, the chip selection signal CS may be a two-bit data, for example, a binary stream of '01'. In an embodiment, the chip identification CID may be a three-bit data, for example, a binary stream of '000'. One of the memory chips included in any one of the first to fifth memory packages PKG0~PKG4 may be selected by the chip selection signal CS and the chip identification CID. In an embodiment, the bank group address may be a two-bit data, for example, a binary stream of '01'. One of the bank groups included in the selected memory chip may be selected by the bank group address. In an embodiment, the bank address may be a two-bit data, for example, a binary stream of '10'. One of the banks include in the selected bank group may be selected by the bank address. In an embodiment, the row address may be an eighteen-bit data, for example, a binary stream of '000101010101010101'. In an embodiment, the fail information for each package may be a fifteen-bit data, for example, a binary stream of '000001001010100'.

Figure 12:
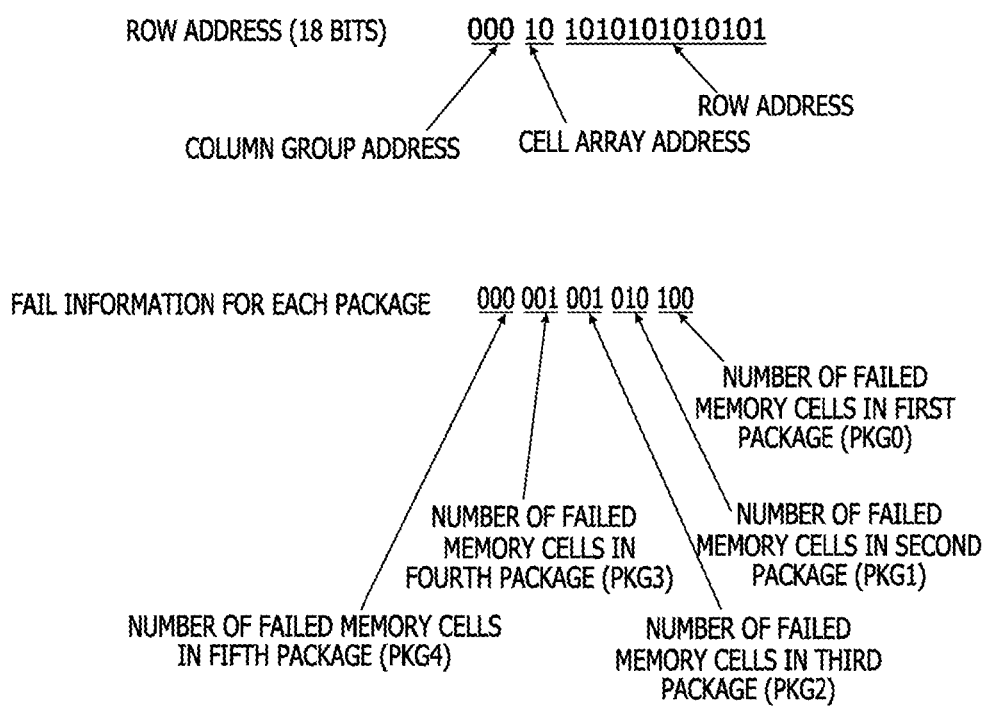
FIG. 12 illustrates configurations of binary data of a row address and package fail information among the fail information illustrated in FIG. 11.

As illustrated in FIG. 12, the eighteen-bit row address may include a thirteen-bit row address comprised of thirteen least significant bits (LSBs), a three-bit column group address comprised of three most significant bits (MSBs), and a two-bit cell array address comprised of two bits between the thirteen-bit row address and the three-bit column group address. In case of the present embodiment, a cell array region having the cell array address of '10' among the cell array regions included in the selected bank may be selected, and a row having the row address of '1010101010101' among a plurality of rows included in the selected cell array region may be selected, and eight memory cells located at eight columns in the selected row may be selected and tested by the column group address of '000'. The number of bits included in the fail information for each package may be determined by the maximum number of failed memory cells in each memory package. In the present embodiment, the maximum number of failed memory cells in each memory package may be four bits. Thus, the number of failed memory cells in each memory package may be expressed using three bits. In the present embodiment, since the number of the memory packages is five, the fail information for each package may be expressed by a binary stream having fifteen bits. In the fail information for each package illustrated in FIG. 12, three-bit low-order data of '100' including the LSB may indicate the number of failed memory cells in the first memory package PKG0, three-bit low-order data of '010' next to the three-bit low-order data of '100' may indicate the number of failed memory cells in the second memory package PKG1, three-bit low-order data of '001' next to the three-bit low-order data of '010' may indicate the number of failed memory cells in the third memory package PKG2, three-bit low-order data of '001' next to the three-bit low-order data of '001' may indicate the number of failed memory cells in the fourth memory package PKG3, and three-bit high-order data of '000' including the MSB may indicate the number of failed memory cells in the fifth memory package PKG4.

Figure 13:
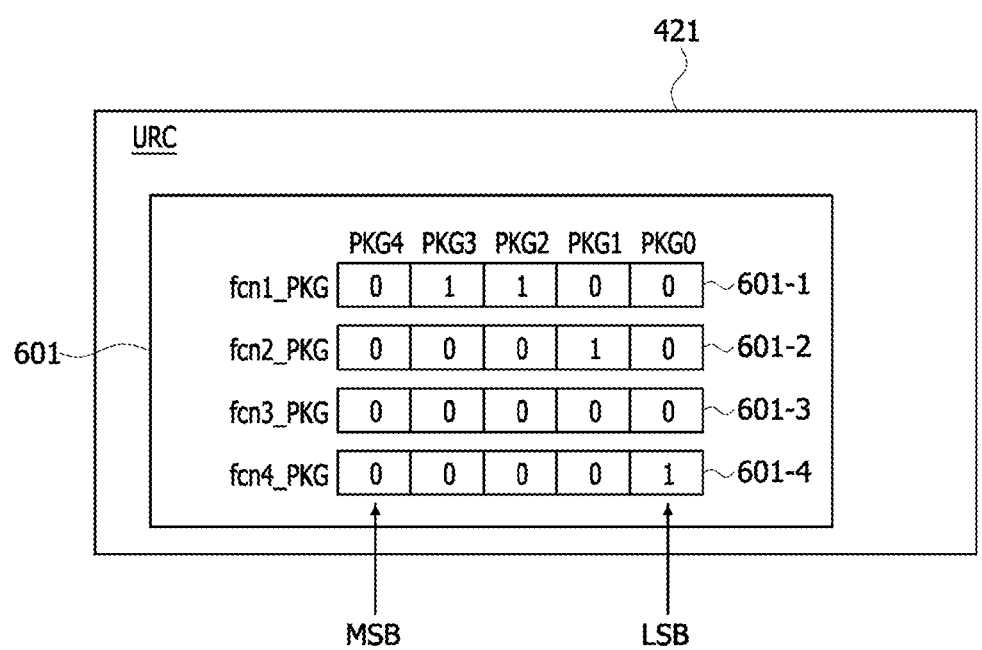
FIG. 13 illustrates an example of fail distribution data stored in a first register of a built-in repair analysis (BIRA) circuit during an operation of a test circuit for a memory device according to an embodiment of the present disclosure.

As illustrated in FIG. 13, the URC circuit 421 may analyze the fail information to generate fail distribution data and to store the fail distribution data into a first register 601 included in the URC circuit 421 (see step 512 of FIG. 7). The first register 601 may include a plurality of storage regions 601-1, 601-2, 601-3 and 601-4, the number of which is equal to the maximum number of the failed memory cells in each memory package. If the maximum number of the failed memory cells in each memory package is four like the present embodiment, the first register 601 may include four storage regions (i.e., first to fourth storage regions 601-1, 601-2, 601-3 and 601-4). Each of the first to fourth storage regions 601-1, 601-2, 601-3 and 601-4 may have a plurality of storage elements, the number of which is equal to the number of the memory packages PKG0~PKG4 included in the memory module 50. Accordingly, each of the first to fourth storage regions 601-1, 601-2, 601-3 and 601-4 may have five storage elements. The five storage elements in each storage region may correspond to the first to fifth memory packages PKG0~PKG4, respectively. For example, the fail distribution data of the first memory package PKG0 may be stored into the first storage elements corresponding to the first LSBs of the first to fourth storage regions 601-1, 601-2, 601-3 and 601-4, the fail distribution data of the second memory package PKG1 may be stored into the second storage elements corresponding to the second LSBs of the first to fourth storage regions 601-1, 601-2, 601-3 and 601-4, the fail distribution data of the third memory package PKG2 may be stored into the third storage elements corresponding to the third LSBs of the first to fourth storage regions 601-1, 601-2, 601-3 and 601-4, the fail distribution data of the fourth memory package PKG3 may be stored into the fourth storage elements corresponding to the second MSBs of the first to fourth storage regions 601-1, 601-2, 601-3 and 601-4, and the fail distribution data of the fifth memory package PKG4 may be stored into the fifth storage elements corresponding to the first MSBs of the first to fourth storage regions 601-1, 601-2, 601-3 and 601-4.

A datum of '1' may be stored into a storage element corresponding to the memory package having one failed memory cell (fcn=1) among the five storage elements included in the first storage region 601-1, and a datum of '0' may be stored into the other storage elements among the five storage elements included in the first storage region 601-1. Thus, since the number (fcn) of failed memory cells of the third memory package PKG2 and the number (fcn) of failed memory cells of the fourth memory package PKG3 are one, a datum of '1' may be stored into the storage elements corresponding to the third and fourth LSBs of the first storage region 601-1 and a datum of '0' may be stored into the remaining storage elements of the first storage region 601-1. A datum of '1' may be stored into a storage element corresponding to the memory package having two failed memory cells (fcn=2) among the five storage elements included in the second storage region 601-2, and a datum of '0' may be stored into the other storage elements among the five storage elements included in the second storage region 601-2. Thus, since the number (fcn) of failed memory cells of the second memory package PKG1 is two, a datum of '1' may be stored into the storage element corresponding to the second LSB of the second storage region 601-2 and a datum of '0' may be stored into the remaining storage elements of the second storage region 601-2. Since there is no memory package having three failed memory cells (fcn=3) in the memory module 50, a datum of '0' may be stored into all of the storage elements included in the third storage region 601-3. In addition, since the first memory package PKG0 has four failed memory cells (fcn=4), a datum of '1' may be stored into the storage element corresponding to the first LSB of the fourth storage region 601-4 and a datum of '0' may be stored into the remaining storage elements of the fourth storage region 601-4.

Figure 14:
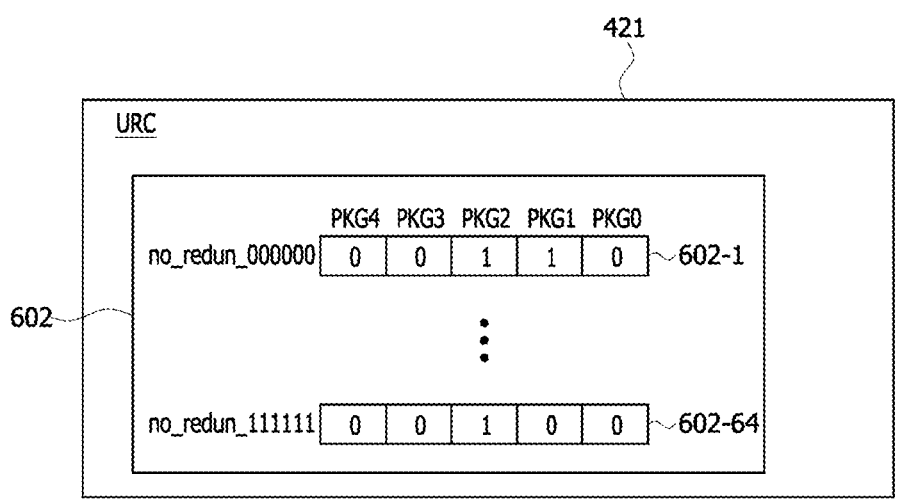
FIG. 14 illustrates an example of redundancy region information stored in a second register of a built-in repair analysis (BIRA) circuit during an operation of a test circuit for a memory device according to an embodiment of the present disclosure.

As illustrated in FIG. 14, after the redundancy region information on each of the memory packages PKG0~PKG4 is stored into a second register 602 of the URC circuit 421, whether each of the memory packages PKG0~PKG4 has an unusable redundancy region is discriminated (see a step 513 of FIG. 7). Specifically, the URC circuit 421 may receive the redundancy region information on each of the memory packages PKG0~PKG4 from the memory packages PKG0~PKG4 through the TM circuit 430. The redundancy region information may include information on whether each of the memory packages PKG0~PKG4 has a usable redundancy region. For example, the memory package including the unusable redundancy region that has already used in a previous repair process not to have available redundant memory cells may be expressed using a datum of '1'. In contrast, the memory package including the usable redundancy region with available redundant memory cells may be expressed using a datum of '0'.

The second register 602 storing the redundancy region information may have $2^6$ storage regions (i.e., first to sixty-fourth storage regions 602-1, . . . and 602-64). Thus, each of the first to sixty-fourth storage regions 602-1, . . . and 602-64 may be selected by a six-bit address. In an embodiment, the first storage region 602-1 of the second register 602 may have an address of '000000'. The sixty-fourth storage region 602-64 of the second register 602 may have an address of '111111'. First and second LSBs in the six-bit address of any one of the first to sixty-fourth storage regions 602-1, . . . and 602-64 may be identical to two bits indicating a cell array address among the eighteen bits constituting the row address described with reference to FIG. 12. Third and fourth LSBs in the six-bit address of any one of the first to sixty-fourth storage regions 602-1, . . . and 602-64 may be identical to two bits constituting the bank address. Fifth and sixth (i.e., first and second MSBs) in the six-bit address of any one of the first to sixty-fourth storage regions 602-1, . . . and 602-64 may be identical to two bits constituting the bank group address. Accordingly, the first storage region 602-1 having an address of '000000' may correspond to a cell array region having a bank group address of '00', a bank address of '00' and a cell array address of '00'. Similarly, the sixty-fourth storage region 602-64 having an address of '111111' may correspond to a cell array region having a bank group address of '11', a bank address of '11' and a cell array address of '11'.

Each of the first to sixty-fourth storage regions 602-1, . . . and 602-64 may have a plurality of storage elements, the number of which is identical to the number of the memory packages included in the memory module 50. If the memory module 50 includes the five memory packages PKG0~PKG4 like the present embodiment, each of the first to sixty-fourth storage regions 602-1, . . . and 602-64 may have five storage elements. The five storage elements may correspond to the five memory packages PKG0~PKG4, respectively. For example, the redundancy region information on the first memory package PKG0 may be stored into the first storage elements corresponding to the first LSBs of the first to sixty-fourth storage regions 602-1, . . . and 602-64, the redundancy region information on the second memory package PKG1 may be stored into the second storage elements corresponding to the second LSBs of the first to sixty-fourth storage regions 602-1, . . . and 602-64, the redundancy region information on the third memory package PKG2 may be stored into the third storage elements corresponding to the third LSBs of the first to sixty-fourth storage regions 602-1, . . . and 602-64, the redundancy region information on the fourth memory package PKG3 may be stored into the fourth storage elements corresponding to the fourth LSBs (i.e., the second MSBs) of the first to sixty-fourth storage regions 602-1, . . . and 602-64, and the redundancy region information on the fifth memory package PKG4 may be stored into the fifth storage elements corresponding to the first MSBs of the first to sixty-fourth storage regions 602-1, . . . and 602-64. As illustrated in FIG. 14, if binary data of '0', '0', '1', '1' and '0' are respectively stored in the storage elements of the first storage region 602-1, the redundancy regions of the cell array regions selected by the bank group address of '00', the bank address of '00' and the cell array address of '00' among the cell array regions of the second and third memory packages PKG1 and PKG2 may mean the unusable redundancy regions which are no longer usable in a repair process and the redundancy regions of the remaining memory packages (i.e., the first, fourth and fifth memory packages PKG0, PKG3 and PKG4) may mean the usable redundancy regions having redundant memory cells which are available in a repair process. In addition, if binary data of '0', '0', '1', '0' and '0' are respectively stored in the storage elements of the sixty-fourth storage region 602-64, the redundancy region of the cell array region selected by the bank group address of '11', the bank address of '11' and the cell array address of '11' among the cell array regions of the third memory package PKG2 may mean the unusable redundancy region which is no longer usable in a repair process and the redundancy regions of the remaining memory packages (i.e., the first, second, fourth and fifth memory packages PKG0, PKG1, PKG3 and PKG4) may mean the usable redundancy region having redundant memory cells which are available in a repair process.

Figure 15:
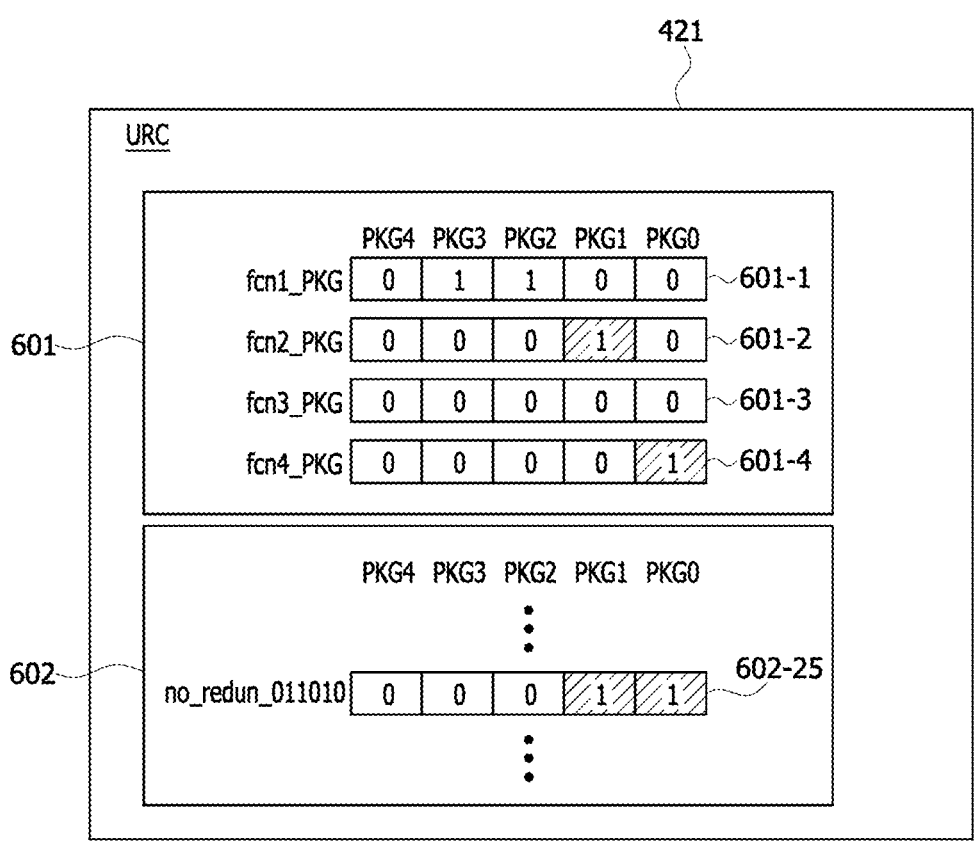
FIG. 15 illustrates an example of a step of comparing information in a first register with information in a second register to reflect redundancy region information in selecting a repair target memory package during an operation of a test circuit for a memory device according to an embodiment of the present disclosure.
Figure 16:
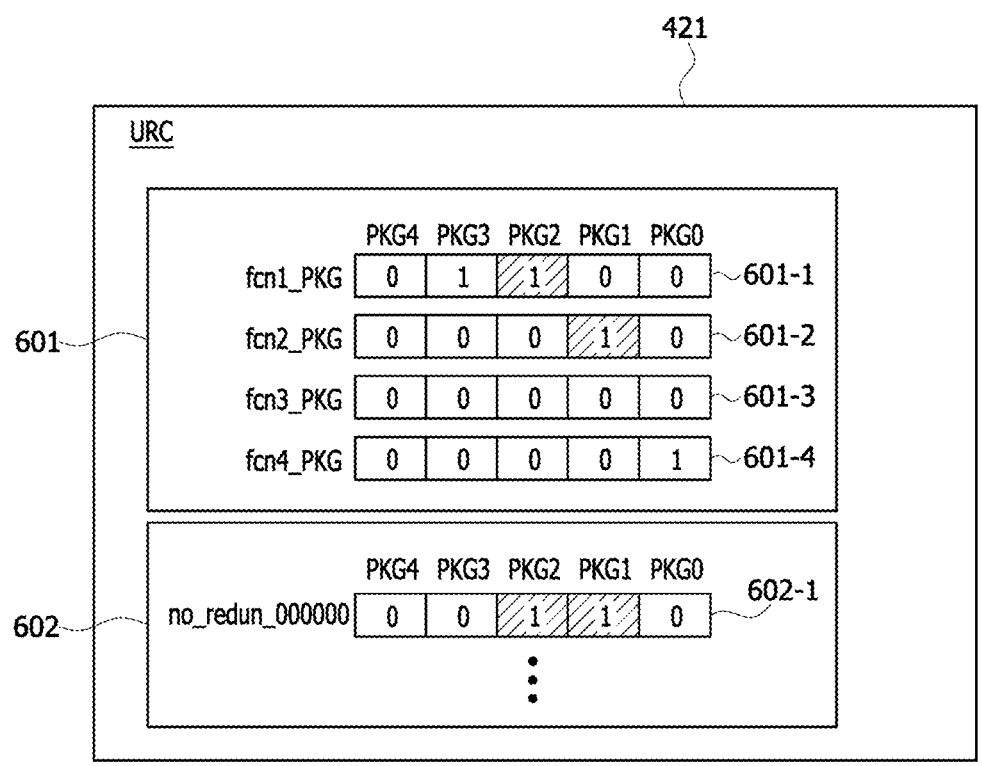
FIG. 16 illustrates another example of a step of comparing information in a first register with information in a second register to reflect redundancy region information in selecting a repair target memory package during an operation of a test circuit for a memory device according to an embodiment of the present disclosure.

If there is no memory package with the unusable redundancy region at the step 513, a step 517 of FIG. 8 may be performed. If there is a memory package having the unusable redundancy region at the step 513, the number (fcn) of failed memory cells included in the cell array regions having the unusable redundancy regions in the memory package may be calculated and the number (fcn) may be compared with the failure criterion (FC) (see a step 514 of FIG. 7). If the number (fcn) is equal to or greater than the failure criterion (FC) at the step 514, a step 515 of FIG. 7 may be performed. If the number (fcn) is less than the failure criterion (FC) at the step 514, a step 516 of FIG. 7 may be performed. The step 514 may be performed using the fail distribution data stored in the first register 601 of the URC circuit 421 and the redundancy region information stored in the second register 602 of the URC circuit 421, as illustrated in FIGS. 15 and 16. The fail distribution data stored in the first register 601 may correspond to information on the number (fcn) of failed memory cells included in the cell array regions having the unusable redundancy regions in each of the memory packages PKG0~PKG4. The redundancy region information stored in the second register 602 may correspond to information on whether the redundancy regions in each the memory packages PKG0~PKG4 are usable in a repair process. Thus, whether each of the redundancy regions included in the memory packages PKG0~PKG4 is usable in a repair process may be firstly discriminated to perform the step 514.

FIG. 15 illustrates the step 514 when a test target cell array region having the bank group address of '01', the bank address of '10' and the cell array address of '10' is tested by the built-in repair analysis (BIRA) operation. In such a case, no usable redundancy region is in the first and second memory packages PKG0 and PKG1 indicated by a datum '1' stored in the twenty-fifth storage region 602-25 of the second register 602. In contrast, the redundancy regions included in the third to fifth memory packages PKG2, PKG3 and PKG4 may be usable in a repair process. Next, the total number of all of failed memory cells in the memory packages (i.e., the first and second memory packages PKG0 and PKG1) having the unusable redundancy regions may be calculated. According to the first register 601, the first memory package PKG0 has four failed memory cells (fcn=4) and the second memory package PKG1 has two failed memory cells (fcn=2). Thus, the total number of failed memory cells in the first and second memory packages PKG0 and PKG1 may be six. In such a case, since the total number of failed memory cells in the first and second memory packages PKG0 and PKG1 is greater than the failure criterion (FC) of four, the step 515 of FIG. 7 may be performed.

As such, if the total number of failed memory cells in the first and second memory packages PKG0 and PKG1 is greater than the failure criterion (FC) of four, the step 515 may be performed to set a built-in repair analysis (BIRA) fail flag (see the step 515 of FIG. 7). The built-in repair analysis (BIRA) fail flag may have a logic "high" level of a logic "low" level. A case that the total number of failed memory cells in the memory packages having the unusable redundancy regions is greater than the failure criterion (FC) may mean that the failed memory cells in the test target cell array region cannot be repaired using the redundancy regions and also cannot be corrected using an ECC operation performed by the ECC circuit 404. In such a case, it may be unnecessary to continuously perform the built-in repair analysis (BIRA) operation. Thus, the built-in repair analysis (BIRA) fail flag may be set to stop the built-in repair analysis (BIRA) operation. In an embodiment, if the total number of failed memory cells in the memory packages having the unusable redundancy regions is greater than the failure criterion (FC), the built-in repair analysis (BIRA) fail flag may be set to have a logic "high" level. That is, if the built-in repair analysis (BIRA) fail flag is set to have a logic "high" level, the built-in repair analysis (BIRA) operation may terminate.

FIG. 16 illustrates the step 514 when a test target cell array region having the bank group address of '00', the bank address of '00' and the cell array address of '00' is tested by the built-in repair analysis (BIRA) operation. In such a case, no usable redundancy region is in the second and third memory packages PKG1 and PKG2 indicated by a datum '1' stored in the first storage region 602-1 of the second register 602. In contrast, the redundancy regions included in the first, fourth and fifth memory packages PKG0, PKG3 and PKG4 may be usable in a repair process. Next, the total number of all of failed memory cells in the memory packages (i.e., the second and third memory packages PKG1 and PKG2) having the unusable redundancy regions may be calculated. According to the first register 601, the second memory package PKG1 has two failed memory cells (fcn=2) and the third memory package PKG2 has one failed memory cell (fcn=1). Thus, the total number of failed memory cells in the second and third memory packages PKG1 and PKG2 may be three. In such a case, since the total number of failed memory cells in the second and third memory packages PKG1 and PKG2 is less than the failure criterion (FC) of four, the step 516 of FIG. 7 may be performed.

If the total number of failed memory cells in the memory packages having the unusable redundancy regions is less than the failure criterion (FC) at the step 514, an updated failure criterion (uFC) may be calculated (see the step 516). The updated failure criterion (uFC) may be calculated by subtracting the total number of failed memory cells in the memory packages having the unusable redundancy regions from the failure criterion (FC). As illustrated in FIG. 16, since the total number of failed memory cells in the second and third memory packages PKG1 and PKG2 having the unusable redundancy regions is three, the updated failure criterion (uFC) may be calculated by subtracting three from four to have one. This means that the three failed memory cells in the second and third memory packages PKG1 and PKG2 having the unusable redundancy regions need to be corrected using the ECC circuit 404 because the three failed memory cells cannot be repaired by the unusable redundancy regions. Thus, in such a case, three bits among four bits corresponding to the failure criterion (FC) of four may be assigned to correction of the failed memory cells (i.e., the three failed memory cells) in the memory packages having the unusable redundancy regions, and only the remaining one bit may be used as the failure criterion (FC) in a subsequent step.

If there is no memory package having the unusable redundancy region at the step 513 or the updated failure criterion (uFC) is calculated at the step 516 since the total number of failed memory cells in the memory packages having the unusable redundancy regions is less than the failure criterion (FC) at the step 514, the RARFC circuit 423 may discriminate whether a fail row address exists in the RARF 450 (see the step 517 of FIG. 8). The fail row address may be defined as a row address of a cell array region (including a failed memory cell) which is currently tested. Thus, if the fail row address is stored in the RARF 450, it means that the cell array region being currently tested corresponds to a repair target cell array region. The RARFC circuit 423 may verify whether the fail row address exists in the RARF 450 and may transmit the verification result to the RA circuit 422. In an embodiment, the RARFC circuit 423 may transmit a datum of '1' to the RA circuit 422 if the fail row address exists in the RARF 450 and may transmit a datum of '0' to the RA circuit 422 if no fail row address exists in the RARF 450.

Figure 17:
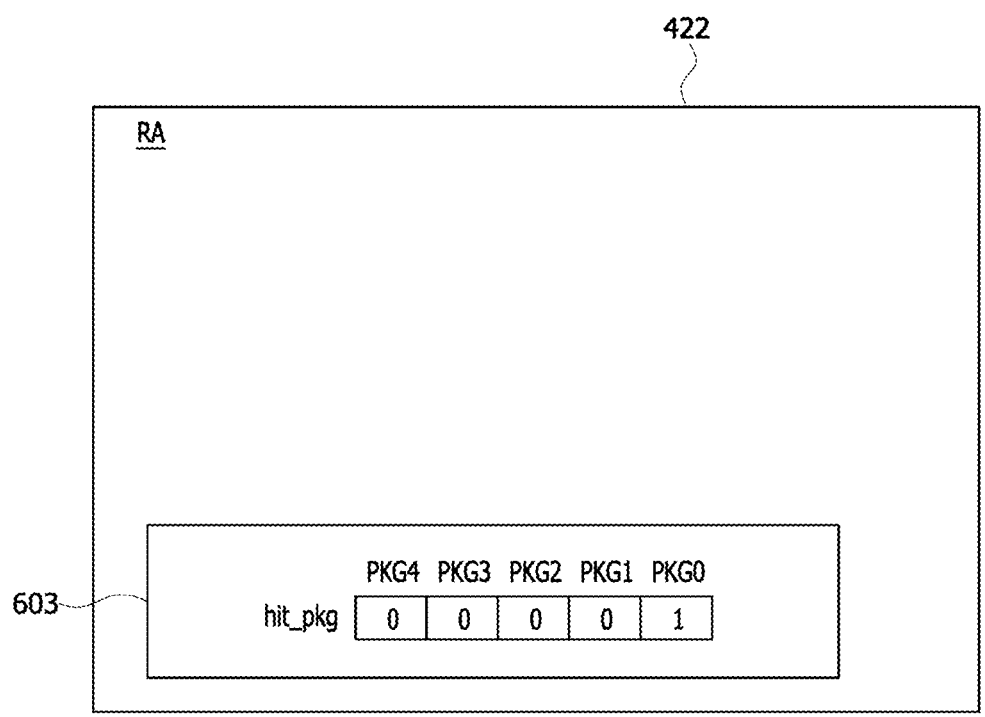
FIG. 17 illustrates a third register of a built-in repair analysis (BIRA) circuit in which an address of a redundancy region to be repaired is stored during an operation of a test circuit for a memory device according to an embodiment of the present disclosure.

As illustrated in FIG. 17, the RA circuit 422 may store the verification result outputted from the RARFC circuit 423 into a third register 603 included in the RA circuit 422. The third register 603 may have a plurality of storage elements. The number of the storage elements included in the third register 603 may be the same as the number of the memory packages PKG0~PKG4. Five data on whether the fail row address exists in the first to fifth memory packages PKG0~PKG4 may be stored in first to fifth storage elements of the third register 603, respectively. As illustrated in FIG. 17, if data of '0', '0', '0', '0' and '1' are respectively stored in the storage elements of the third register 603, it means that only the fail row address of the first memory package PKG0 exists in the RARF 450 and fail row addresses of the second to fifth memory packages PKG1~PKG4 do not exist in the RARF 450.

Figure 18:
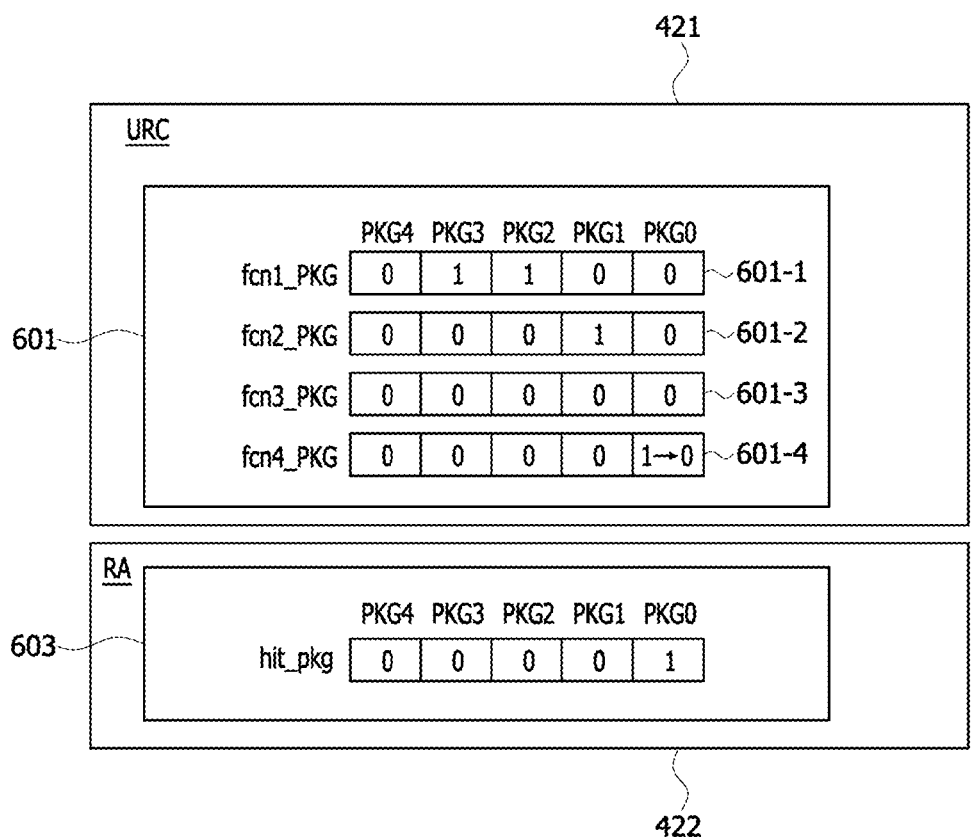
FIG. 18 illustrates an example of a step of comparing information in a first register with information in a third register to reflect redundancy region information in selecting a repair target memory package during an operation of a test circuit for a memory device according to an embodiment of the present disclosure.

If the fail row address exists in the RARF 450 at the step 517, a sum (Σfcn) of the numbers (fcn) of failed memory cells included in the cell array regions having the unusable redundancy regions in the memory packages may be calculated and the information on the fail distribution data stored in the first register 601 of the URC circuit 421 may be changed (see a step 518 of FIG. 8). Thus, the fail distribution datum of the memory package (i.e., the first memory package PKG0) relating to the fail row address existing in the RARF 450 among the fail distribution data stored in the first register 601 of the URC circuit 421 may be reset as zero. Since a datum of '1' is stored in the storage element corresponding to the first memory package PKG0 among the storage elements of the third register 603 of the RA circuit 422, the datum of '1' stored in the LSB of the fourth storage region 601-4, which is provided to store the number (fcn=4)

of the failed memory cells in the first memory package PKG0, among the storage elements of the first register 601 may be reset to be zero as illustrated in FIG. 18. In addition, a sum (Σfcn) of the numbers (fcn) stored in the first register 601 may be updated. In the present embodiment, since the sum (Σfcn) of the numbers (fcn) stored in the first register 601 is eight and the number (fcn=4) of failed memory cells in the first memory package PKG0 is reset as zero, the updated sum (Σfcn) of the numbers (fcn) of failed memory cells may be four. As such, the updated sum (Σfcn) of the numbers (fcn) of failed memory cells may be calculated by subtracting the number of failed memory cells in the memory package having the fail row address existing in the RARF 450 from the sum (Σfcn) of the numbers (fcn) of failed memory cells in all of the memory packages PKG0~PKG4.

After the updated sum (Σfcn) of the numbers (fcn) of failed memory cells is calculated, the updated sum (Σfcn) of the numbers (fcn) of failed memory cells is compared with the updated failure criterion (uFC) (see a step 519). The step 519 may be performed by the RA circuit 422. At the step 519, a comparison target of the updated sum (Σfcn) of the numbers (fcn) of failed memory cells may be different according to whether the memory package having the unusable redundancy region exists at the step 513 of FIG. 7. For example, if there is no memory package having the unusable redundancy region at the step 513 of FIG. 7, the updated sum (Σfcn) of the numbers (fcn) of failed memory cells may be compared with the failure criterion (FC) at the step 519 of FIG. 8. In contrast, if there is a memory package having the unusable redundancy region at the step 513 of FIG. 7, the updated sum (Σfcn) of the numbers (fcn) of failed memory cells may be compared with the updated failure criterion (uFC) at the step 519 of FIG. 8. If the updated sum (Σfcn) of the numbers (fcn) of failed memory cells is equal to or greater than the failure criterion (FC) or the updated failure criterion (uFC) at the step 519, a step 520 of FIG. 8 may be performed. A case that the updated sum (Σfcn) of the numbers (fcn) of failed memory cells is less than the failure criterion (FC) or the updated failure criterion (uFC) at the step 519 means that the number of failed memory cells which are capable of being corrected using the ECC operation performed by the ECC circuit 404 is greater than the number of failed memory cells to be repaired. Accordingly, if the updated sum (Σfcn) of the numbers (fcn) of failed memory cells is less than the failure criterion (FC) or the updated failure criterion (uFC) at the step 519, the built-in repair analysis (BIRA) operation may terminate because it is unnecessary to perform a repair process of the memory package having the failed memory cells.

If no fail row address exists in the RARF 450 at the step 517 or the updated sum (Σfcn) of the numbers (fcn) of failed memory cells is equal to or greater than the failure criterion (FC) or the updated failure criterion (uFC) at the step 519, a repair target memory package may be selected (see the step 520). This step 520 of selecting the repair target memory package may be performed under a certain rule for maximizing the number of memory packages to be corrected using the ECC operation executed by the ECC circuit 404 as well as minimizing the number of memory packages to be repaired. The repair target memory package may be selected using one of various methods under the certain rule. One of the various methods of selecting the repair target memory package will be described hereinafter with reference to a flowchart illustrated in FIG. 19. According to the following description for selecting the repair target memory package, a memory package having the largest number (fcn) of failed memory cells (or the largest updated number (ufcn) of failed memory cells) may be selected as the repair target memory package, and other memory packages having the failed memory cells may then be selected as the repair target memory packages in order of the number (fcn) of failed memory cells (or the updated number (ufcn) of failed memory cells) from the memory package having the smallest number (fcn) of failed memory cells.

In an example of the step 520 for selecting the repair target memory package, the number (fcn) of failed memory cells might not be changed if the comparison result of the step 517 is 'N(no)' but be changed by the step 518 if the comparison result of the step 517 is 'Y(yes)'. In addition, the failure criterion (FC) may be updated by the step 516 to provide the updated failure criterion (uFC) or might not be updated. If there is no memory package with the unusable redundancy region at the step 513 of FIG. 7 (corresponding to 'N' of the step 513), the number (fcn) of failed memory cells and the failure criterion (FC) may have non-updated values at the step 520. In contrast, if the number (fcn) of failed memory cells in the cell array regions having the unusable redundancy regions is less than the failure criterion (FC) at the step 514 (corresponding to 'N' of the step 514) and no fail row address exists in the RARF 450 at the step 517 of FIG. 8 (corresponding to 'N' of the step 517), only the failure criterion (FC) may be updated. Accordingly, in such a case, the updated failure criterion (uFC) instead of the failure criterion (FC) may be applied to the following steps. If the number (fcn) of failed memory cells in the cell array regions having the unusable redundancy regions is less than the failure criterion (FC) at the step 514 (corresponding to 'N' of the step 514) and the fail row address exists in the RARF 450 at the step 517 of FIG. 8 (corresponding to 'Y' of the step 517), both of the number (fcn) of failed memory cells and the failure criterion (FC) may be updated. Thus, in such a case, the updated number (ufcn) of failed memory cells and the updated failure criterion (uFC) instead of the number (fcn) of failed memory cells and the failure criterion (FC) may be applied to the following steps. The following description may be developed in conjunction with an example in which the number (fcn) of failed memory cells and the failure criterion (FC) are not updated.

Figure 20:
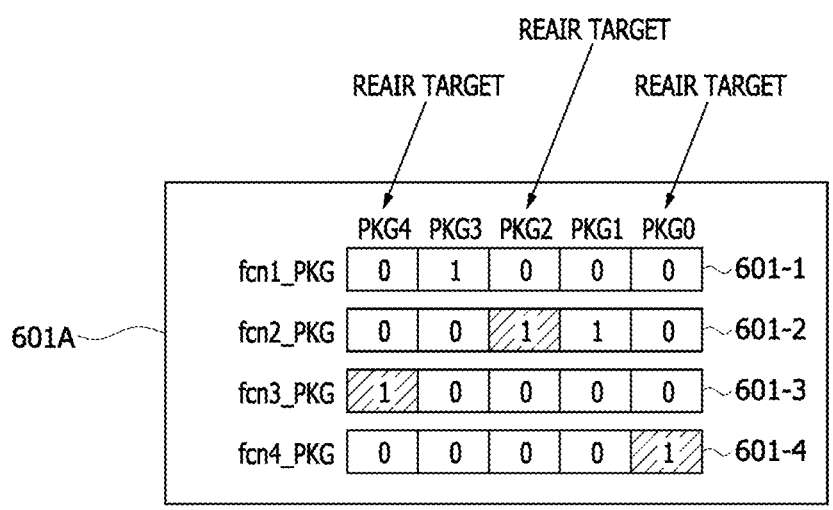
FIG. 20 illustrates an example of a first register included in a built-in repair analysis (BIRA) circuit after a repair target memory package is selected while an operation of a test circuit according to an embodiment is performed.
Figure 21:
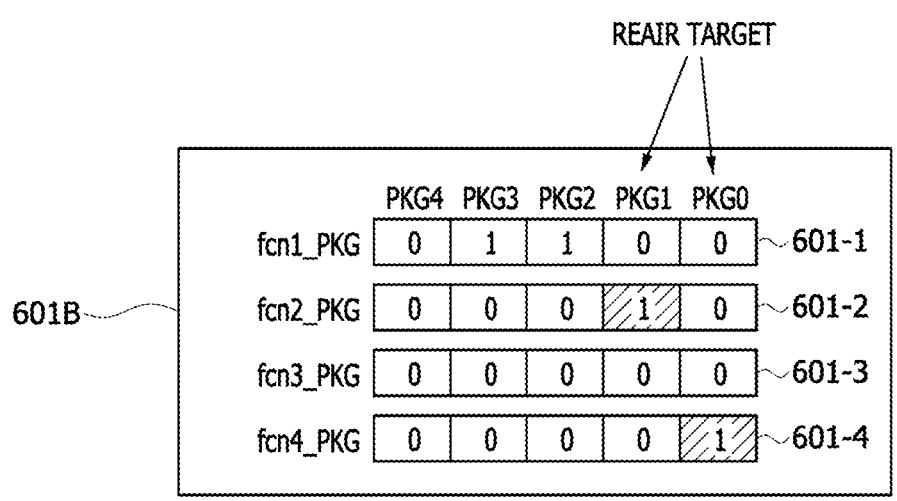
FIG. 21 illustrates another example of a first register included in a built-in repair analysis (BIRA) circuit after a repair target memory package is selected while an operation of a test circuit according to an embodiment is performed.

The step 520 of selecting the repair target memory package may be performed by the RA circuit 422. The RA circuit 422 may access to the first register 601 of the URC circuit 421. A method of selecting the repair target memory package will be described hereinafter with reference to FIG. 19 in conjunction with three examples illustrated in FIGS. 20, 21 and 22. FIG. 20 illustrates a first register 601A corresponding to an example in which the first memory package PKG0 has four failed memory cells (fcn=4), each of the second and third memory packages PKG1 and PKG2 has two failed memory cells (fcn=2), the fourth memory package PKG3 has one failed memory cell (fcn=1), and the fifth memory package PKG4 has three failed memory cells (fcn=3). FIG. 21 illustrates a first register 601B corresponding to another example in which the first memory package PKG0 has four failed memory cells (fcn=4), the second memory packages PKG1 has two failed memory cells (fcn=2), each of the third and fourth memory packages PKG2 and PKG3 has one failed memory cell (fcn=1), and the fifth memory package PKG4 has no failed memory cells (fcn=0). FIG. 22 illustrates a first register 601C corresponding to yet another example in which the first memory package PKG0 has four failed memory cells (fcn=4) and each of the second to fifth memory packages PKG1~PKG4 has one failed memory cell (fcn=1).

Figure 19:
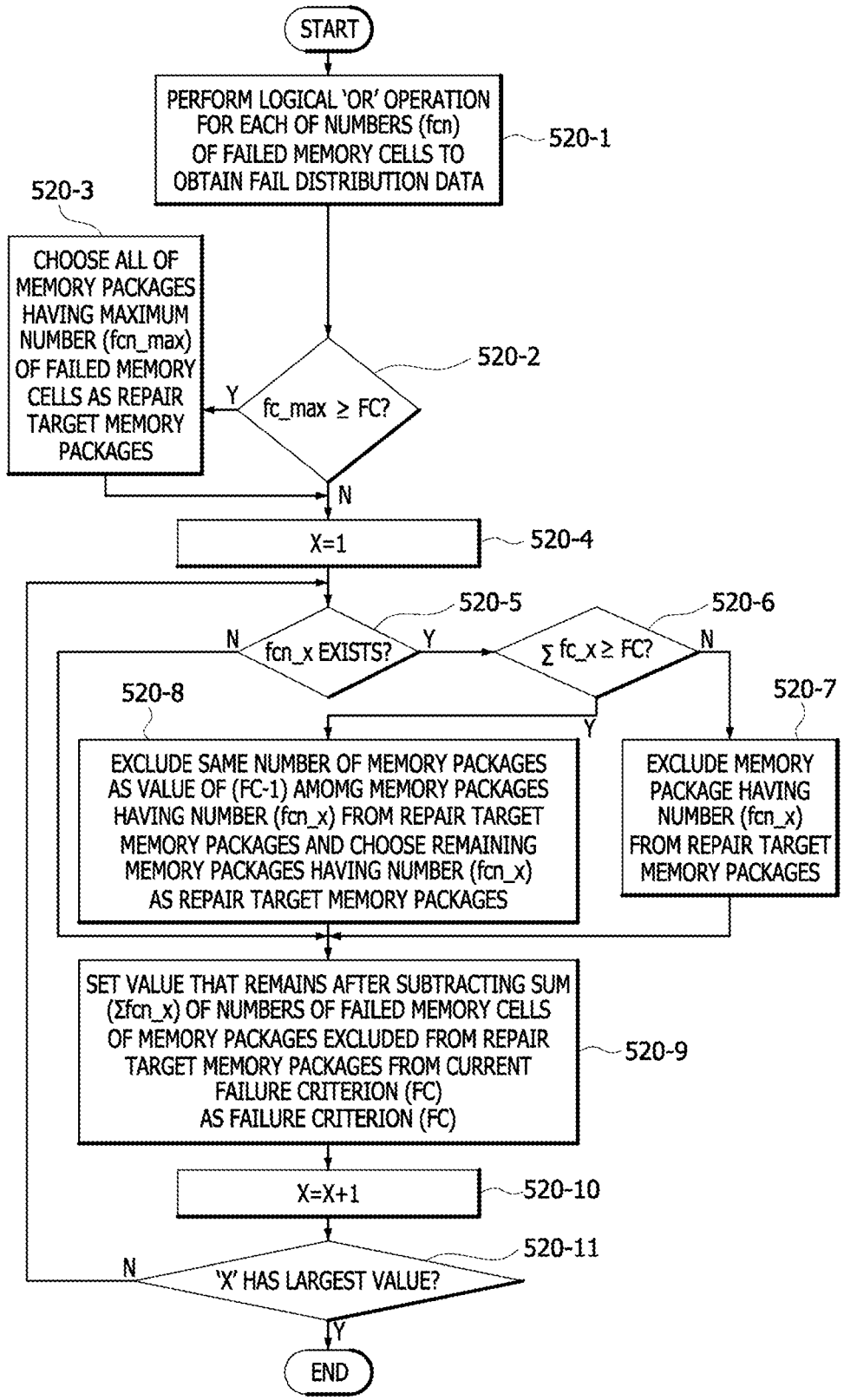
FIG. 19 is a flowchart illustrating an example of a step of selecting a repair target memory package during an operation of a test circuit for a memory device according to an embodiment of the present disclosure.

As illustrated in FIG. 19, a logical 'OR' operation for each of the numbers (fcns) of failed memory cells may be performed to obtain the fail distribution data of the repair target memory packages (see a step 520-1). The step 520-1 may be achieved by the RA circuit 422 accessing to the first register 601 of the URC circuit 421. It may be assumed that the maximum allowable number of failed memory cells in each of the memory packages PKG0~PKG4 is 'K' (where, 'K' is a natural number). In such a case, the fail distribution data of the repair target memory packages may be represented by expressing the presence/absence of the memory package having the corresponding number of failed memory cells as a logic level of '1' or '0' in order of the number (fcn) of failed memory cells from 'K' to one. If the maximum allowable number of failed memory cells in each of the memory packages PKG0~PKG4 is four as described in the present embodiment, the fail distribution data of the repair target memory packages may be provided in the form of {presence/absence of a memory package having four failed memory cells (fcn=4), presence/absence of a memory package having three failed memory cells (fcn=3), presence/absence of a memory package having two failed memory cells (fcn=2), presence/absence of a memory package having one failed memory cell (fcn=1)}.

The presence/absence of a memory package having four failed memory cells (fcn=4) may be determined by performing a logical 'OR' operation for adding all of the values stored in the storage elements of the fourth storage region 601-4 of the first register 601. The presence/absence of a memory package having three failed memory cells (fcn=3) may be determined by performing a logical 'OR' operation for adding all of the values stored in the storage elements of the third storage region 601-3 of the first register 601. The presence/absence of a memory package having two failed memory cells (fcn=2) may be determined by performing a logical 'OR' operation for adding all of the values stored in the storage elements of the second storage region 601-2 of the first register 601. The presence/absence of a memory package having one failed memory cell (fcn=1) may be determined by performing a logical 'OR' operation for adding all of the values stored in the storage elements of the first storage region 601-1 of the first register 601. Accordingly, in case of the example illustrated in FIG. 20, the fail distribution data of the repair target memory packages may be represented as {1,1,1,1}. This means that all of the memory packages having four failed memory cells (fcn=4), three failed memory cells (fcn=3), two failed memory cells (fcn=2) and one failed memory cell (fcn=1) exist in the memory module 50. In case of the example illustrated in FIG. 21, the fail distribution data of the repair target memory packages may be represented as {1,0,1,1}. This means that all of the memory packages having four failed memory cells (fcn=4), two failed memory cells (fcn=2) and one failed memory cell (fcn=1) exist in the memory module 50 and no memory package having three failed memory cells (fcn=3) exists in the memory module 50. In case of the example illustrated in FIG. 22, the fail distribution data of the repair target memory packages may be represented as {1,0,0,1}. This means that the memory packages having four failed memory cells (fcn=4) and one failed memory cell (fcn=1) exist in the memory module 50 and no memory packages having two failed memory cells (fcn=2) and three failed memory cells (fcn=3) exist in the memory module 50.

Next, the maximum number (fcn_max) of failed memory cells may be compared with the failure criterion (FC) to discriminate whether the maximum number (fcn_max) of failed memory cells is less than the failure criterion (FC) or not (see a step 520-2). This is because the possibility that the memory package having the maximum number (fcn_max) of failed memory cells is selected as the repair target memory package is highest. If the maximum number (fcn_max) of failed memory cells is equal to or greater than the failure criterion (FC) at the step 520-2 (corresponding to 'Y' of the step 520-2), all of the memory packages having the maximum number (fcn_max) of failed memory cells may be selected as the repair target memory packages because the memory packages having the maximum number (fcn_max) of failed memory cells cannot be corrected by the ECC operation performed by the ECC circuit 404 (see a step 520-3). In the examples illustrated in FIGS. 20, 21 and 22, the maximum number (fcn_max) of failed memory cells is four and the value of four is equal to the failure criterion (FC). Thus, the first memory package PKG0 having four failed memory cells (fcn=4) may be selected as the repair target memory package.

If the maximum number (fcn_max) of failed memory cells is less than the failure criterion (FC) at the step 520-2 (corresponding to 'N' of the step 520-2) or after the step 520-3 is performed, a parameter 'X' may be set to be one (see a step 520-4). The parameter 'X' represents the number of failed memory cells. Thus, if the parameter 'X' is one, it means that the number of failed memory cells is one. That is, after the repair target memory package is selected in consideration of the maximum number (fcn_max) of failed memory cells, another repair target memory package may be additionally selected in consideration of a minimum number (fcn_min) of failed memory cells (i.e., fcn=1). Next, whether a memory package having the number of failed memory cells corresponding to a parameter 'fcn_x' exists may be discriminated (see a step 520-5). Since the parameter 'x' is set to be one at the step 520-4, whether a memory package having one failed memory cell (i.e., 'fcn_1') exists may be discriminated at the step 520-5. If no memory package having one failed memory cell (i.e., 'fcn_1') exists (corresponding to 'N' of the step 520-5), a step 520-9 may be performed. If a memory package having one failed memory cell (i.e., 'fcn_1') exists (corresponding to 'Y' of the step 520-5), a sum ($\Sigma fcn\_1$) of the numbers (fcn_1) of failed memory cells is compared with the failure criterion (FC) to discriminate whether the sum ($\Sigma fcn\_1$) of the numbers (fcn_1) of failed memory cells is less than the failure criterion (FC) or not (see a step 520-6).

If the sum ($\Sigma fcn\_1$) of the numbers (fcn_1) of failed memory cells is less than the failure criterion (FC) at the step 520-6 (corresponding to 'N' of the step 520-6), a memory package having one failed memory cell (fcn_1) may be excluded from the repair target memory packages (see a step 520-7). Thus, the memory package having one failed memory cell (fcn_1) might not be repaired using the redundancy region but be corrected using the ECC operation performed by the ECC circuit 404. In the example of FIG. 20, since the sum ($\Sigma fcn\_1$) of the numbers (fcn_1) of failed memory cells is one, the sum ($\Sigma fcn\_1$) of the numbers (fcn_1) of failed memory cells may be less than the failure criterion (FC) of four. Thus, the fourth memory package PKG3 having one failed memory cell (fcn_1) may be excluded from the repair target memory packages. Similarly, in the example of FIG. 21, since the sum ($\Sigma fcn\_1$) of the numbers (fcn_1) of failed memory cells is two, the sum ($\Sigma fcn\_1$) of the numbers (fcn_1) of failed memory cells may be less than the failure criterion (FC) of four. Thus, the third memory package PKG2 and the fourth memory package PKG3 having one failed memory cell (fcn_1) may be excluded from the repair target memory packages.

If the sum (Σfcn_1) of the numbers (fcn_1) of failed memory cells is equal to or greater than the failure criterion (FC) at the step 520-6 (corresponding to 'Y' of the step 520-6), the same number of memory packages as a value less than the failure criterion (FC) among the memory packages having one failed memory cells (fcn_1) may be excluded from the repair target memory packages and the remaining memory packages having one failed memory cells (fcn_1) may be selected as the repair target memory packages (see a step 520-8). Thus, the memory packages having one failed memory cell (fcn_1) excluded from the repair target memory packages may be corrected using the ECC operation performed by the ECC circuit 404 without using the redundancy region. In the example of FIG. 22, since the sum (Σfcn_1) of the numbers (fcn_1) of failed memory cells is four, the sum (Σfcn_1) of the numbers (fcn_1) of failed memory cells may be equal to the failure criterion (FC) of four. Thus, in such a case, three of the second to fifth memory packages PKG1~PKG4 may be excluded from the repair target memory packages, and the remaining one of the second to fifth memory packages PKG1~PKG4 may be selected as the repair target memory package. In the event that at least one of the memory packages having the same number of failed memory cells is selected as the repair target memory package, the at least one memory package may be selected as the repair target memory package under the certain rule. For example, according to the certain rule, the memory package corresponding to the storage element having a lowest weight may be firstly excluded from the repair target memory packages. In the example of FIG. 22, the second to fourth memory packages PKG1, PKG2 and PKG3 among the memory packages having one failed memory cell (fcn_1) may be excluded from the repair target memory packages, and the fifth memory package PKG4 may be selected as the repair target memory package.

After the step 520-7 or the step 520-8 is performed, the failure criterion (FC) may be set to have a value that remains after subtracting the sum (Σfcn_1) of the numbers (fcn_1) of failed memory cells of the memory packages excluded from the repair target memory packages from the current failure criterion (FC) (see the step 520-9). In the example of FIG. 20, the sum (Σfcn_1) of the numbers (fcn_1) of failed memory cells of the memory packages excluded from the repair target memory packages may be one after the step 520-7. Thus, the failure criterion (FC) may be set as three which is obtained by subtracting one from the current failure criterion (FC) of four. Similarly, in the example of FIG. 21, the sum (Σfcn_1) of the numbers (fcn_1) of failed memory cells of the memory packages excluded from the repair target memory packages may be two after the step 520-7. Thus, the failure criterion (FC) may be set as two which is obtained by subtracting two from the current failure criterion (FC) of four. In the example of FIG. 22, the sum (Σfcn_1) of the numbers (fcn_1) of failed memory cells of the memory packages excluded from the repair target memory packages may be three after the step 520-8. Thus, the failure criterion (FC) may be set as one which is obtained by subtracting three from the current failure criterion (FC) of four. After the step 520-9 is performed, the parameter 'X' may be set as '(X+1)' (see a step 520-10. Thus, the memory packages having two failed memory cells (fcn_2) may then be verified to select the repair target memory packages. Next, whether the parameter 'X' has the largest value is discriminated (see a step 520-11). The largest value of the parameter 'X' means the maximum allowable number (fcn_max) of failed memory cells in each of the memory packages. If the parameter 'X' has two, which is less than the largest value, at the step 520-11, the steps 520-5 to 520-10 may be iteratively performed again. If the parameter 'X' has the largest value (i.e., the maximum allowable number (fcn_max)) at the step 520-11, the operation of selecting the repair target memory packages may terminate because the operation of selecting the repair target memory packages for the case of the maximum allowable number (fcn_max)) was firstly performed.

In the example of FIG. 20, if the parameter 'X' has two, the sum (Σfcn_2) of the numbers (fcn_2) of failed memory cells of the memory packages may be four which is greater than the failure criterion (FC) of two that is newly set (see the steps 520-5 and 520-6). Thus, the step 520-8 may be performed. Since there is no memory package, the number of failed memory cells of which is less than the failure criterion (FC) of two at the step 520-8, the second memory package PKG1 may be selected as the repair target memory package. In the example of FIG. 21, if the parameter 'X' has two, the sum (Σfcn_2) of the numbers (fcn_2) of failed memory cells of the memory packages may be two which is equal to the failure criterion (FC) of two that is newly set (see the steps 520-5 and 520-6). Thus, the step 520-8 may be performed. At the step 520-8, the second memory package PKG1 corresponding to the storage element having two failed memory cells (fcn_2) which is equal to the failure criterion (FC) of two may be selected as the repair target memory package. In such a case, the sum (Σfcn_2) of the numbers of failed memory cells of the memory package excluded from the repair target memory packages may be zero. Accordingly, at the step 520-9, the failure criterion (FC) may still maintain a value of two.

After the step 520 of FIG. 8 described above is performed, whether the redundancy regions in the repair target memory packages are usable redundancy regions may be discriminated (see a step 521 of FIG. 9). The step 521 may be performed by the RARFC circuit 423. The result of the step 521 may depend on whether the RARF 450 has a storage space which is capable of storing addresses of the redundancy regions in the repair target memory packages. For example, the RARFC circuit 423 may receive information on the memory packages selected as the repair target memory packages from the RA circuit 422. In addition, whether the RARF 450 has a storage space which is capable of storing the addresses of the redundancy regions in the repair target memory packages may be verified. If no storage space capable of storing the address of the redundancy region in any one of the repair target memory packages is in the RARF 450 at the step 521 (corresponding to 'N' of the step 521), the BIST retry flag signal may be set to perform the built-in self-test (BIST) operation again (see a step 523 of FIG. 9). Alternatively, if the built-in self-test (BIST) operation is performed by a predetermined schedule in a subsequent step, the step 523 of FIG. 9 may be omitted. If the storage space capable of storing the address of the redundancy region in the repair target memory package is in the RARF 450 at the step 521 (corresponding to 'Y' of the step 521), the RARFC circuit 423 may store the address of the redundancy region in the repair target memory package into the RARF 450 (see a step 522).

The word "predetermined" as used herein with respect to a parameter, such as a predetermined schedule, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In the example of FIG. 20, if the test operation described above terminates, a repair process for the first memory package PKG0 having four failed memory cells (fcn4), the fifth memory package PKG4 having three failed memory cells (fcn3), and the third memory package PKG2 having two failed memory cells (fcn2) may be performed using the redundancy regions disposed in the first, fifth and third memory packages PKG0, PKG4 and PKG2. The second memory package PKG1 having two failed memory cells (fcn2) and the fourth memory package PKG3 having one failed memory cell (fcn1) may be excluded from the repair target memory packages. That is, erroneous data of the second memory package PKG1 having two failed memory cells (fcn2) and the fourth memory package PKG3 having one failed memory cell (fcn1) may be corrected using the ECC operation. In the example of FIG. 21, if the test operation described above terminates, a repair process for the first memory package PKG0 having four failed memory cells (fcn4) and the second memory package PKG1 having two failed memory cells (fcn2) may be performed using the redundancy regions disposed in the first and second memory packages PKG0 and PKG1. The third and fourth memory packages PKG2 and PKG3 having one failed memory cell (fcn1) may be excluded from the repair target memory packages. That is, erroneous data of the third and fourth memory packages PKG2 and PKG3 having one failed memory cell (fcn1) may be corrected using the ECC operation. In the example of FIG. 22, if the test operation described above terminates, a repair process for the first memory package PKG0 having four failed memory cells (fcn4) may be performed using the redundancy region disposed in the first memory package PKG0. In addition, the fifth memory package PKG4 having one failed memory cells (fcn1) may also be repaired using the redundancy region disposed in the fifth memory package PKG4. The second, third and fourth memory packages PKG1, PKG2 and PKG3 having one failed memory cell (fcn1) may be excluded from the repair target memory packages. That is, erroneous data of the second, third and fourth memory packages PKG1, PKG2 and PKG3 having one failed memory cell (fcn1) may be corrected using the ECC operation.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A test circuit comprising:
a built-in self-test (BIST) circuit configured to perform a test operation for a plurality of memory packages to generate fail information; and
a built-in repair analysis (BIRA) circuit configured to receive the fail information from the BIST circuit to select at least one of the plurality of memory packages as a repair target memory package,
wherein the repair target memory package is selected by considering an error correction capability of an error correction code (ECC) circuit and usability of redundancy regions included in each of the plurality of memory packages, and
wherein the built-in repair analysis (BIRA) circuit terminates the test operation if a sum of the number of failed memory cells in the memory packages without usable redundancy regions among the memory packages having the failed memory cells is equal to or greater than a failure criterion value.

2. The test circuit of claim 1, wherein the failure criterion value is set as a natural number which is equal to or less than the error correction capability.

3. The test circuit of claim 2, wherein the built-in repair analysis (BIRA) circuit performs an operation of selecting the repair target memory package if no memory package without the usable redundancy regions exists in the memory packages having the failed memory cells and no memory package to be repaired exists in the memory packages having the failed memory cells.

4. The test circuit of claim 3, wherein the built-in repair analysis (BIRA) circuit selects as the repair target memory packages, all memory packages that have a greater number of the failed memory cells than the failure criterion value.

5. The test circuit of claim 4,
wherein the built-in repair analysis (BIRA) circuit excludes some memory packages from the repair target memory packages;
wherein the excluded memory packages are selected in order of the number of the failed memory cells from the memory package having the fewest failed memory cells among the memory packages having the failed memory cells, the number of which is equal to or less than the failure criterion value, in the memory packages having the failed memory cells; and
wherein a sum of the numbers of the failed memory cells in the memory packages excluded from the repair target memory packages is equal to or less than the failure criterion value.

6. The test circuit of claim 2,
wherein the built-in repair analysis (BIRA) circuit calculates an updated sum of the numbers of the failed memory cells by subtracting a sum of the numbers of the failed memory cells in the memory packages to be repaired from a sum of the numbers of the failed memory cells in the memory packages having the failed memory cells if no memory package without the usable redundancy regions exists in the memory packages having the failed memory cells and a memory package to be repaired exists in the memory packages having the failed memory cells;
wherein the built-in repair analysis (BIRA) circuit terminates the test operation if the updated sum of the numbers of the failed memory cells is less than the failure criterion value; and
wherein the built-in repair analysis (BIRA) circuit performs an operation of selecting the repair target memory package if the updated sum of the numbers of the failed memory cells is equal to or greater than the failure criterion value.

7. The test circuit of claim 6, wherein the built-in repair analysis (BIRA) circuit selects all of memory packages having a greater number of the failed memory cells than the failure criterion value among the memory packages remaining after excluding the memory packages to be repaired from the memory packages having the failed memory cells as the repair target memory packages.

8. The test circuit of claim 7,
wherein the built-in repair analysis (BIRA) circuit excludes some memory packages from the repair target memory packages;
wherein the excluded memory packages are selected in order of the number of the failed memory cells from the memory package having the fewest failed memory cells among the memory packages remaining after excluding the memory packages to be repaired from the memory packages having the failed memory cells; and wherein a sum of the numbers of the failed memory cells in the memory packages excluded from the repair target memory packages is equal to or less than the failure criterion value.

9. The test circuit of claim 2, wherein the built-in repair analysis (BIRA) circuit calculates an updated failure criterion value obtained by subtracting a sum of the numbers of the failed memory cells in the memory packages without the usable redundancy regions from the failure criterion value if the sum of the numbers of the failed memory cells in the memory packages without the usable redundancy regions among the memory packages having the failed memory cells is less than the failure criterion value.

10. The test circuit of claim 9, wherein the built-in repair analysis (BIRA) circuit performs an operation of selecting the repair target memory package if no memory package to be repaired exists in the memory packages having the failed memory cells.

11. The test circuit of claim 10, wherein the built-in repair analysis (BIRA) circuit selects, as the repair target memory packages, all memory packages that have a greater number of the failed memory cells than the updated failure criterion value.

12. The test circuit of claim 11,
wherein the built-in repair analysis (BIRA) circuit excludes some memory packages from the repair target memory packages;
wherein the excluded memory packages are selected in order of the number of the failed memory cells from the memory package having the fewest failed memory cells among the memory packages having the failed memory cells, the number of which is equal to or less than the updated failure criterion value, in the memory packages having the failed memory cells; and
wherein a sum of the numbers of the failed memory cells in the memory packages excluded from the repair target memory packages is equal to or less than the updated failure criterion value.

13. The test circuit of claim 9,
wherein the built-in repair analysis (BIRA) circuit calculates an updated sum of the numbers of the failed memory cells by subtracting a sum of the numbers of the failed memory cells in the memory packages to be repaired from a sum of the numbers of the failed memory cells in the memory packages having the failed memory cells if a memory package to be repaired exists in the memory packages having the failed memory cells;
wherein the built-in repair analysis (BIRA) circuit terminates the test operation if the updated sum of the numbers of the failed memory cells is less than the updated failure criterion value; and
wherein the built-in repair analysis (BIRA) circuit performs an operation of selecting the repair target memory package if the updated sum of the numbers of the failed memory cells is equal to or greater than the updated failure criterion value.

14. The test circuit of claim 13, wherein the built-in repair analysis (BIRA) circuit selects all of memory packages having a greater number of the failed memory cells than the updated failure criterion value among the memory packages remaining after excluding the memory packages to be repaired from the memory packages having the failed memory cells as the repair target memory packages.

15. The test circuit of claim 14,
wherein the built-in repair analysis (BIRA) circuit excludes some memory packages from the repair target memory packages;
wherein the excluded memory packages are selected in order of the number of the failed memory cells from the memory package having the fewest failed memory cells among the memory packages having the failed memory cells, the number of which is equal to or less than the updated failure criterion value, in the memory packages remaining after excluding the memory packages to be repaired from the memory packages having the failed memory cells; and
wherein a sum of the numbers of the failed memory cells in the memory packages excluded from the repair target memory packages is equal to or less than the updated failure criterion value.

16. A memory module comprising:
a plurality of memory packages; and
a module controller configured to control an operation of the plurality of memory packages,
wherein the module controller includes an error correction code (ECC) circuit and a test circuit, and
wherein the test circuit includes:
a built-in self-test (BIST) circuit configured to perform a test operation for the plurality of memory packages to generate fail information; and
a built-in repair analysis (BIRA) circuit configured to receive the fail information from the BIST circuit to select at least one of the plurality of memory packages as a repair target memory package,
wherein the repair target memory package is selected by considering an error correction capability of the error correction code (ECC) circuit and usability of redundancy regions included in each of the plurality of memory packages, and
wherein the built-in repair analysis (BIRA) circuit terminates the test operation if a sum of the number of failed memory cells in the memory packages without usable redundancy regions among the memory packages having the failed memory cells is equal to or greater than a failure criterion value.

17. The memory module of claim 16, wherein the built-in repair analysis (BIRA) circuit includes:
an unrepair control (URC) circuit configured to analyze the fail information to determine execution or nonexecution of a built-in repair analysis (BIRA) operation according to whether a memory package without a usable redundancy region exists in the memory packages having failed memory cells;
a repair address register file (RARF) configured to store a fail row address of each of the memory packages;
a repair analysis (RA) circuit configured to terminate the built-in repair analysis (BIRA) operation or to select the repair target memory package according to whether an address of the redundancy region of the memory package to be repaired among the memory packages having the failed memory cells is stored in the repair address register file (RARF); and
a repair address register file control (RARFC) circuit configured to transmit the address stored in the repair address register file (RARF) to the repair analysis (RA) circuit.

18. The memory module of claim 17, wherein the unrepair control (URC) circuit includes:

a first register configured to store information on the number of the failed memory cells in each of the memory packages having the failed memory cells; and a second register configured to store information on usability of the redundancy regions in each of the memory packages having the failed memory cells.

19. The memory module of claim 18, further comprising a test mode (TM) circuit configured to transmit the information on the usability of the redundancy regions to the unrepair control (URC) circuit.

20. The memory module of claim 18, wherein the unrepair control (URC) circuit compares the information stored in the first register with the information stored in the second register to calculate an updated failure criterion value by subtracting a sum of the numbers of the failed memory cells in the memory packages without the usable redundancy regions from the failure criterion value if no memory package without the usable redundancy regions exists in the memory packages having the failed memory cells or the sum of the numbers of the failed memory cells in the memory packages without the usable redundancy regions is less than a failure criterion value.

21. The memory module of claim 20, wherein the failure criterion value is set as a natural number which is equal to or less than the error correction capability.

22. The memory module of claim 21, wherein the unrepair control (URC) circuit compares the information stored in the first register with the information stored in the second register to terminate the test operation if a sum of the number of failed memory cells in the memory packages without the usable redundancy region is equal to or greater than the failure criterion value.

23. The memory module of claim 21, wherein the repair address register file control (RARFC) circuit transmits information on fail row addresses of the memory packages having the failed memory cells stored in the repair address register file (RARF) to the repair analysis (RA) circuit.

24. The memory module of claim 23, wherein the repair analysis (RA) circuit includes a third register that stores information on the fail row addresses outputted from the repair address register file control (RARFC) circuit.

25. The memory module of claim 24,
wherein the repair analysis (RA) circuit compares the information stored in the first register with the information stored in the information stored in the third register to calculate an updated sum of the numbers of the failed memory cells by subtracting a sum of the numbers of the failed memory cells in the memory packages to be repaired from a sum of the numbers of the failed memory cells in the memory packages having the failed memory cells;

wherein the repair analysis (RA) circuit terminates the test operation if the updated sum of the numbers of the failed memory cells is less than the failure criterion value or the updated failure criterion value; and wherein the repair analysis (RA) circuit performs an operation of selecting the repair target memory package if the updated sum of the numbers of the failed memory cells is equal to or greater than the failure criterion value or the updated failure criterion value.

26. The memory module of claim 25, wherein the repair analysis (RA) circuit selects all of memory packages having a greater number of the failed memory cells than the failure criterion value or the updated failure criterion value among the memory packages remaining after excluding the memory packages to be repaired from the memory packages having the failed memory cells as the repair target memory packages.

27. The memory module of claim 26,
wherein the repair analysis (RA) circuit excludes some memory packages from the repair target memory packages;

wherein the excluded memory packages are selected in order of the number of the failed memory cells from the memory package having the fewest failed memory cells among the memory packages having the failed memory cells, the number of which is equal to or less than the updated failure criterion value, in the memory packages remaining after excluding the memory packages to be repaired from the memory packages having the failed memory cells; and wherein a sum of the numbers of the failed memory cells in the memory packages excluded from the repair target memory packages is equal to or less than the updated failure criterion value.

28. The memory module of claim 27, wherein the repair address register file control (RARFC) circuit is configured to store an address of the redundancy region in the repair target memory package into the repair address register file (RARF) if a storage space capable of storing the address of the redundancy region of the repair target memory package is in the repair address register file (RARF) and is configured to terminate the test operation if no storage space capable of storing the address of the redundancy region of the repair target memory package is in the repair address register file (RARF).

* * * * *